US009559195B2

(12) United States Patent
Hikasa

(10) Patent No.: US 9,559,195 B2
(45) Date of Patent: Jan. 31, 2017

(54) SEMICONDUCTOR DEVICE

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/045,218

(22) Filed: Feb. 16, 2016

(65) Prior Publication Data
US 2016/0211355 A1    Jul. 21, 2016

Related U.S. Application Data

(63) Continuation of application No. 14/630,697, filed on Feb. 25, 2015, now Pat. No. 9,299,820, which is a
(Continued)

(30) Foreign Application Priority Data

Aug. 21, 2012 (JP) ................................. 2012-182168
Aug. 21, 2012 (JP) ................................. 2012-182169
Aug. 12, 2013 (JP) ................................. 2013-167477

(51) Int. Cl.
*H01L 29/732* (2006.01)
*H01L 29/739* (2006.01)
(Continued)

(52) U.S. Cl.
CPC ......... *H01L 29/7397* (2013.01); *H01L 29/063* (2013.01); *H01L 29/0649* (2013.01);
(Continued)

(58) Field of Classification Search
CPC ................. H01L 29/7395; H01L 29/7397
See application file for complete search history.

(56) References Cited

U.S. PATENT DOCUMENTS

| | | |
|---|---|---|
| 6,566,691 B1 | 5/2003 | Inoue et al. |
| 6,953,968 B2 | 10/2005 | Nakamura et al. |
| 7,115,944 B2 | 10/2006 | Nakamura et al. |
| 7,888,733 B2 | 2/2011 | Suekawa |
| 8,994,102 B2 | 3/2015 | Hikasa |
| 2003/0042537 A1 | 3/2003 | Nakamura et al. |
| 2005/0280029 A1 | 12/2005 | Nakamura et al. |
| 2007/0267672 A1 | 11/2007 | Hokomoto et al. |
| 2011/0233684 A1* | 9/2011 | Matsushita ......... H01L 29/1095 257/378 |
| 2012/0292662 A1 | 11/2012 | Matsuura et al. |

FOREIGN PATENT DOCUMENTS

JP    4785334 B2    7/2011

OTHER PUBLICATIONS

Ikunori Takata (Mitsubishi Electric Corporation): "Fundamental Difference between IGBT Operation and Bipolar Junction Transistor Operation" (with its English-language translation), Oct. 16, 2008, pp. 15-20.

(Continued)

*Primary Examiner* — Daniel Shook
(74) *Attorney, Agent, or Firm* — Rabin & Berdo, P.C.

(57) ABSTRACT

A semiconductor device of the present invention includes a semiconductor layer, a plurality of gate trenches formed in the semiconductor layer, a gate electrode filled via a gate insulating film in the plurality of gate trenches, an $n^+$-type emitter region, a p-type base region, and an $n^-$-type drift region disposed, lateral to each gate trench, in order in a depth direction of the gate trench from a front surface side of the semiconductor layer, a $p^+$-type collector region disposed on a back surface side of the semiconductor layer with respect to the $n^-$-type drift region, an emitter trench formed between the plurality of gate trenches adjacent to each other, and a buried electrode filled via an insulating film in the emitter trench, and electrically connected with the $n^+$-type emitter region, and the emitter trench is disposed at an interval of 2 μm or less via an $n^-$-type drift region with the gate trench.

16 Claims, 33 Drawing Sheets

Related U.S. Application Data continuation of application No. 13/969,677, filed on Aug. 19, 2013, now Pat. No. 8,994,102.

(51) Int. Cl.
| | |
|---|---|
| *H01L 29/66* | (2006.01) |
| *H01L 29/10* | (2006.01) |
| *H01L 29/06* | (2006.01) |
| *H01L 29/08* | (2006.01) |
| *H01L 29/423* | (2006.01) |
| *H01L 29/40* | (2006.01) |
| *H01L 29/417* | (2006.01) |

(52) U.S. Cl.
CPC ...... *H01L 29/0696* (2013.01); *H01L 29/0804* (2013.01); *H01L 29/0821* (2013.01); *H01L 29/1004* (2013.01); *H01L 29/1095* (2013.01); *H01L 29/404* (2013.01); *H01L 29/407* (2013.01); *H01L 29/41766* (2013.01); *H01L 29/4236* (2013.01); *H01L 29/66348* (2013.01); *H01L 29/7395* (2013.01); *H01L 29/6634* (2013.01)

(56) References Cited

OTHER PUBLICATIONS

Satoru Machida, Takahide Sugiyama, and Masayasu Ishiko (Toyota Central R&D Labs., Inc.), and Satoshi Yasuda, Jun Saito and Kimimori Hamada (Toyota Motor Corp.): "Investigation of Correlation between Device Structures and Switching Losses of IGBTs" (with its English-language translation), Oct. 29, 2009, pp. 55-59.

So Watanabe, Mutsuhiro Mori, Taiga Aral, Kohsuke Ishibashi, Yasushi Toyoda, Tetsuo Oda, Takashi Harada, Katsuaki Saito (Hitachi, Ltd.) "1.7kV Trench IGBT with Deep and Separate Floating p-Layer Designed for Low Loss, Low EMI Noise, and High Reliability" (with its English-language translation), Oct. 27, 2011, pp. 67-71.

\* cited by examiner

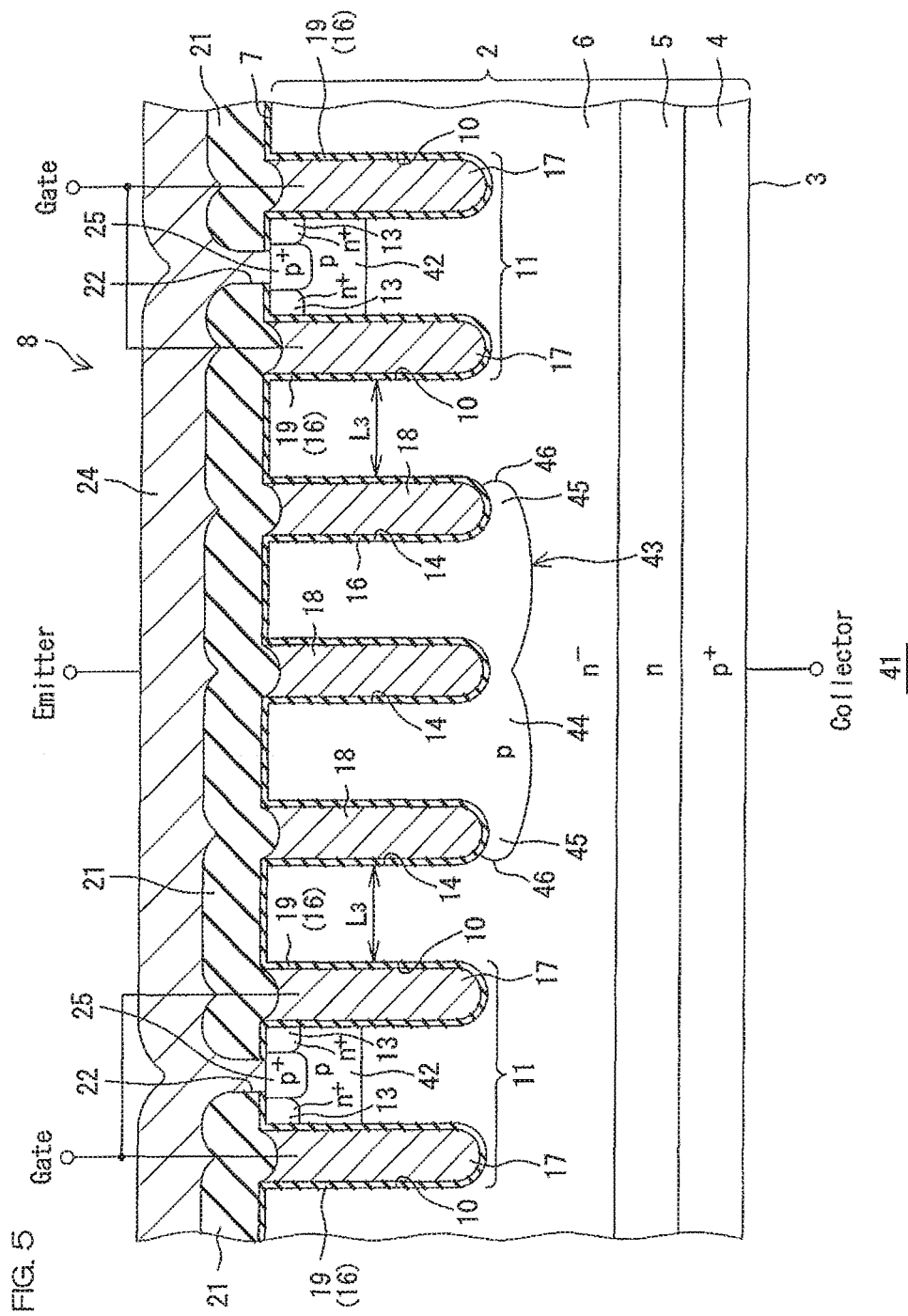

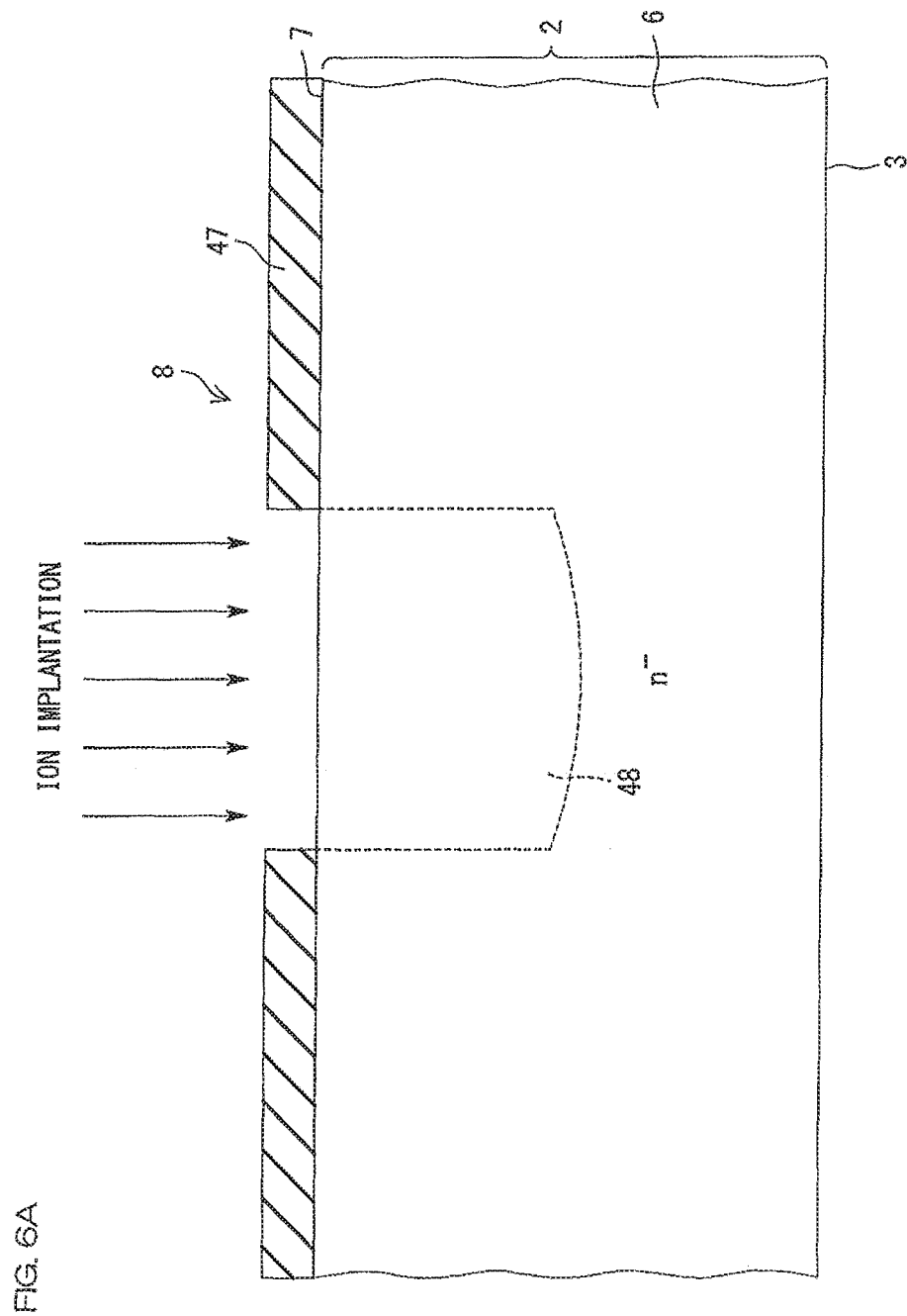

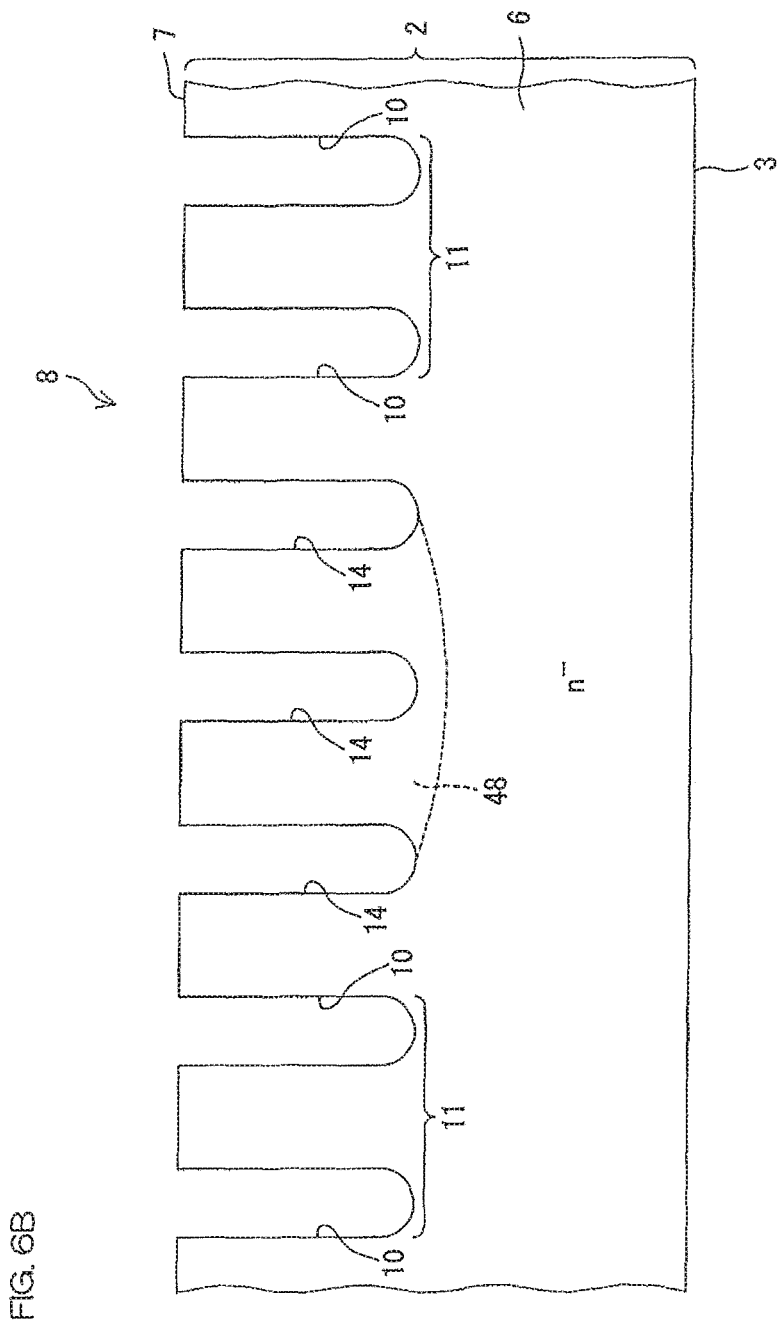

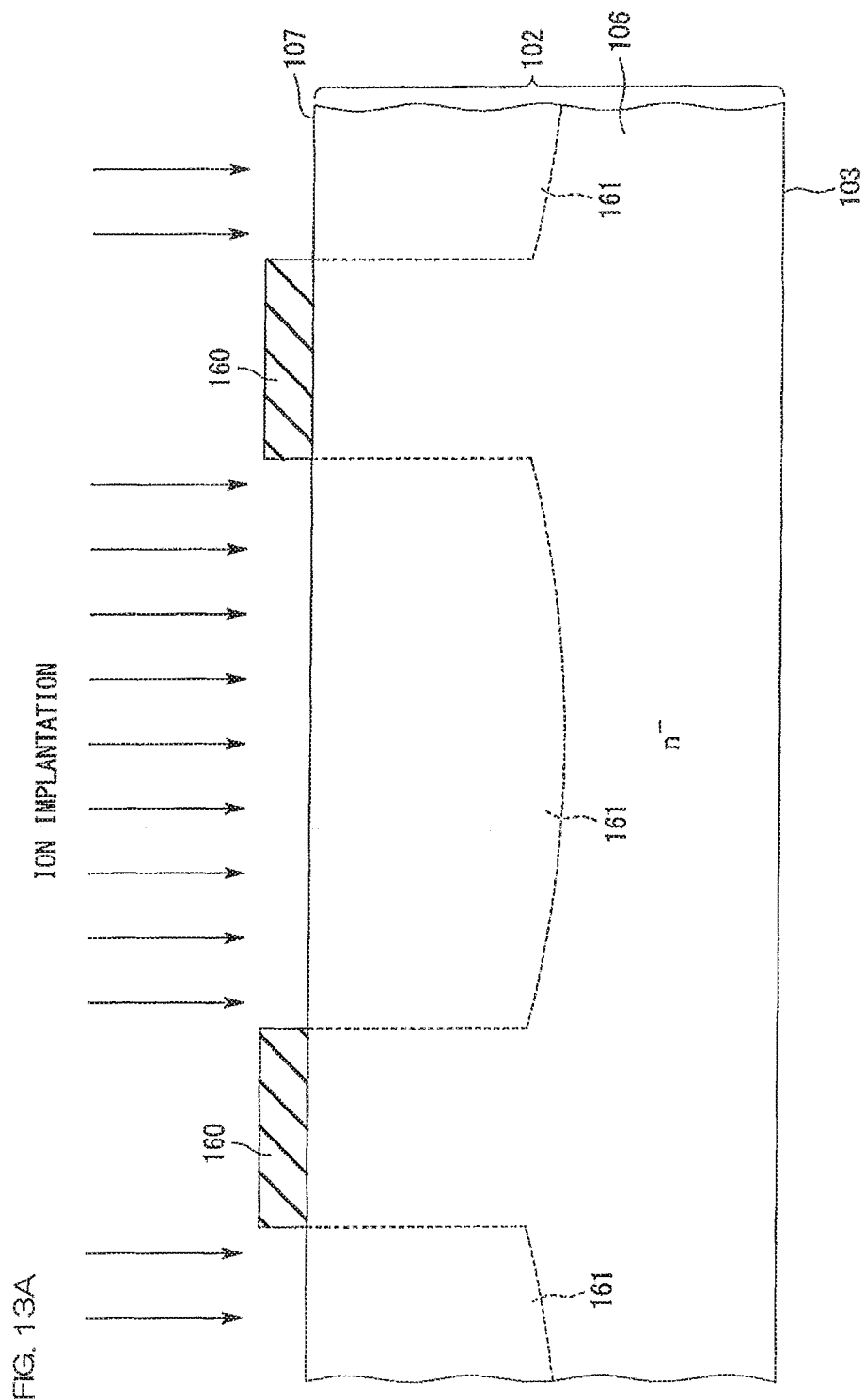

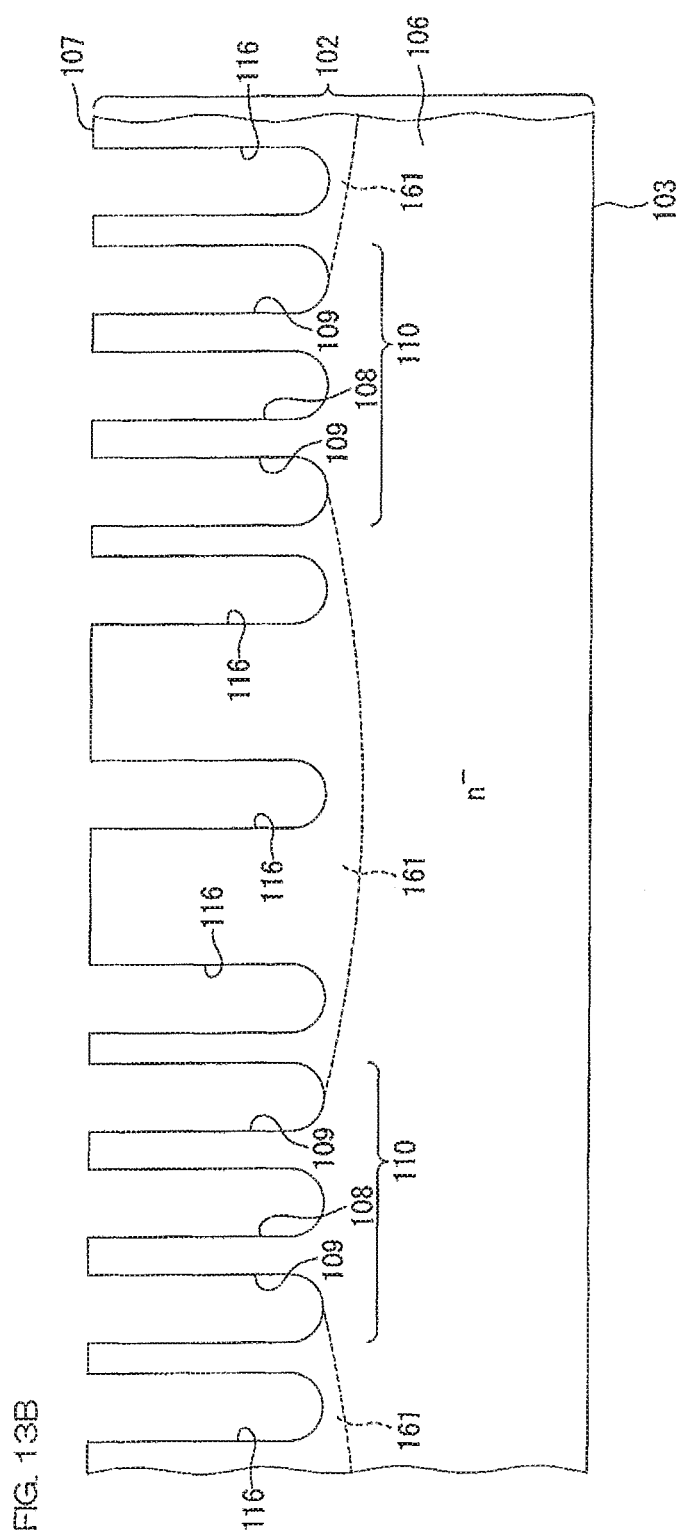

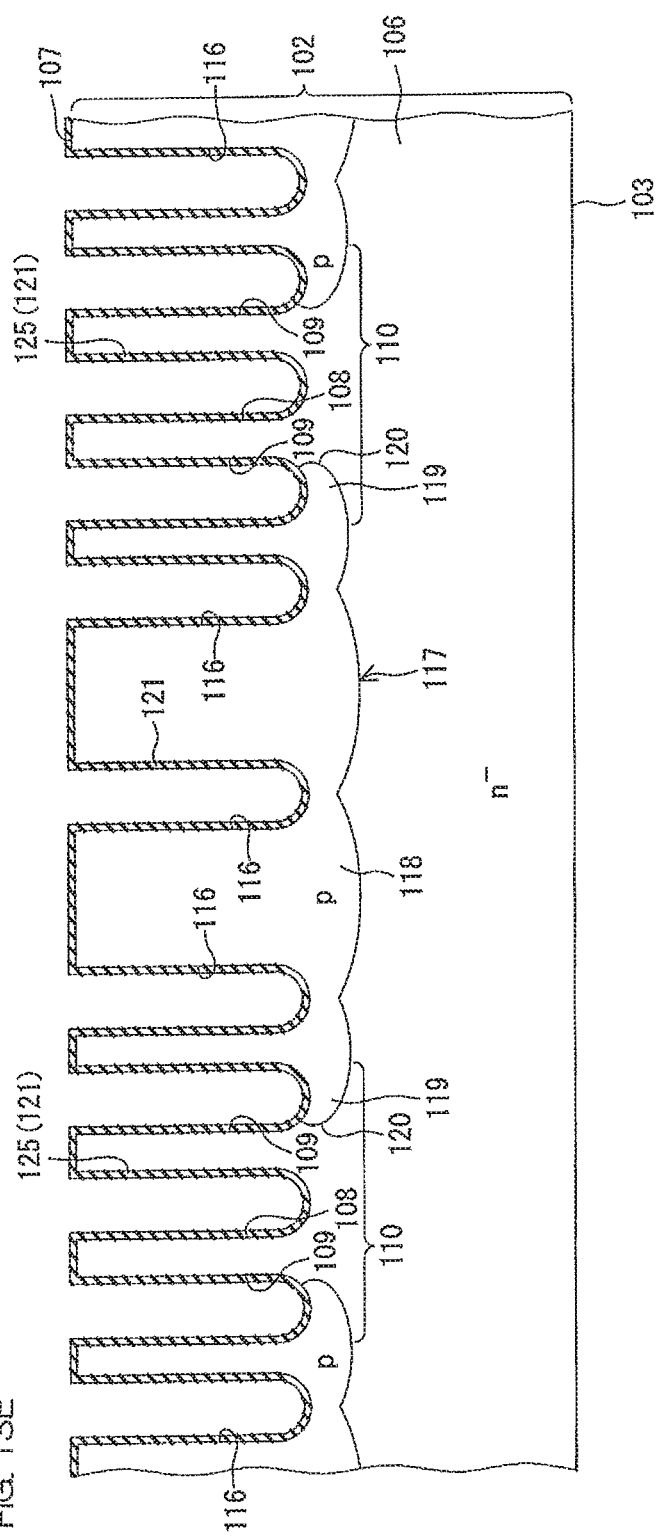

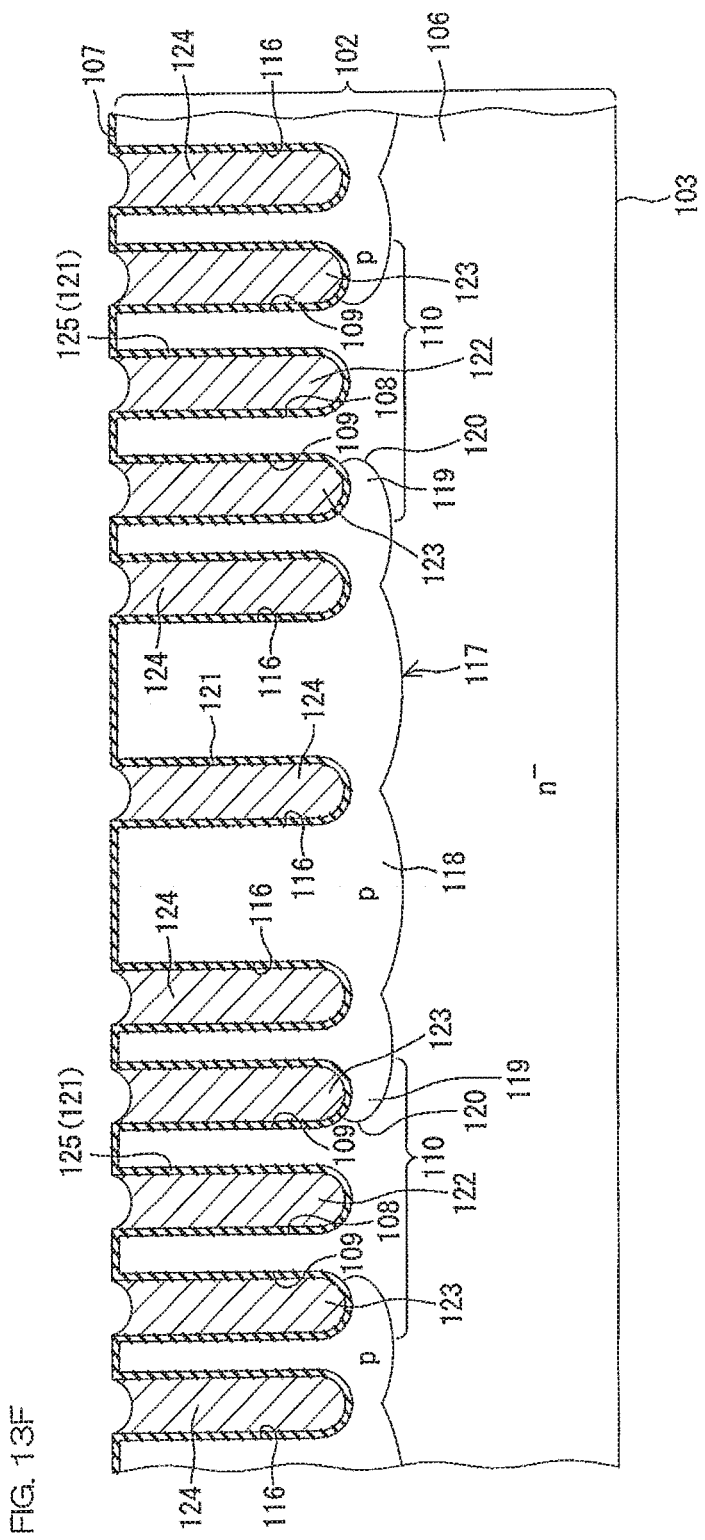

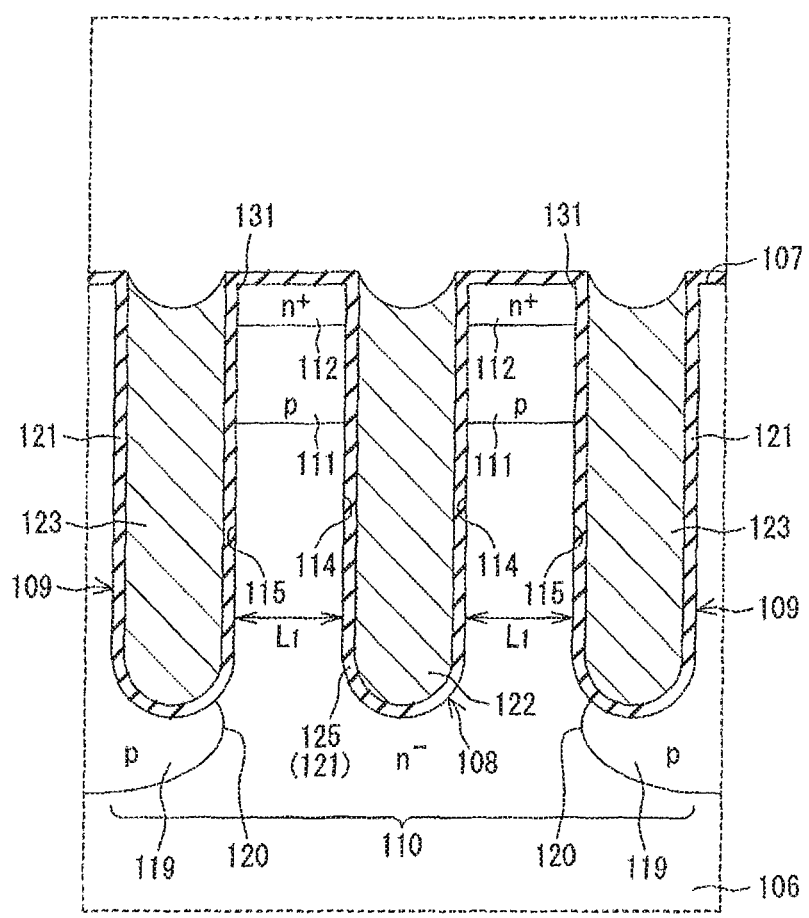

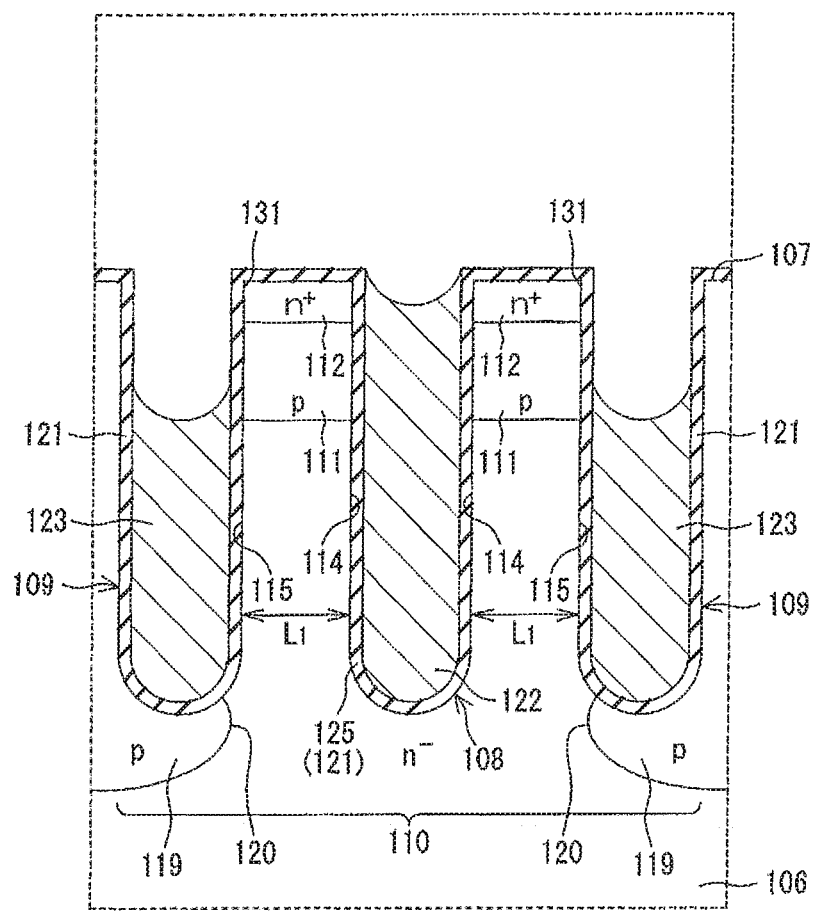

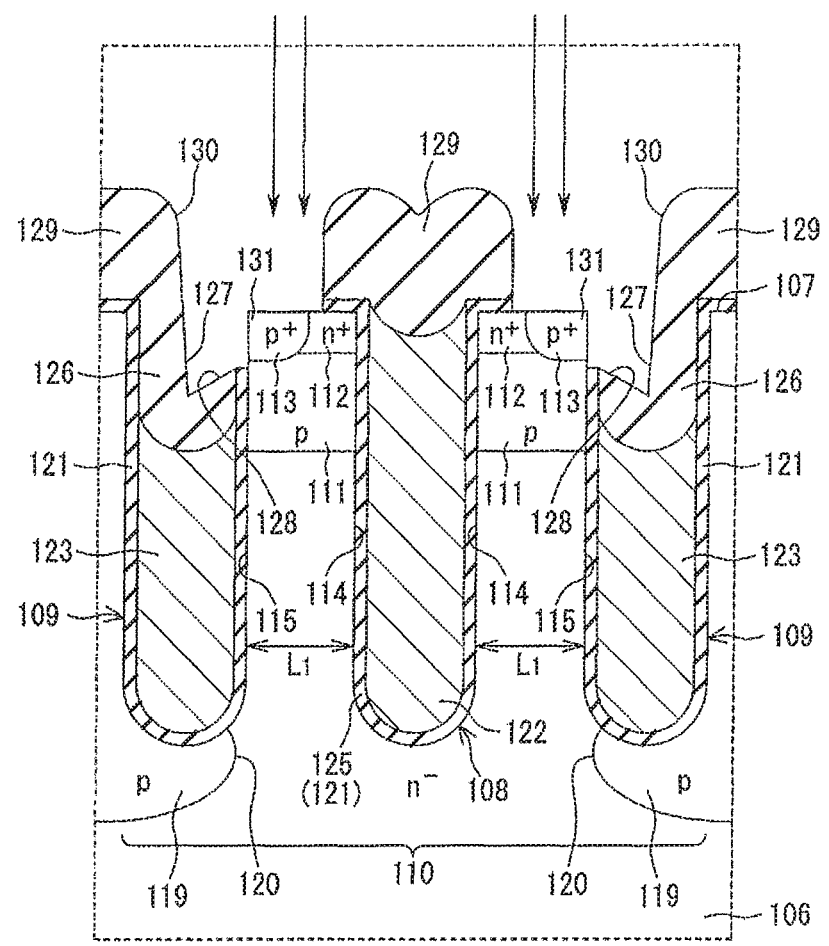

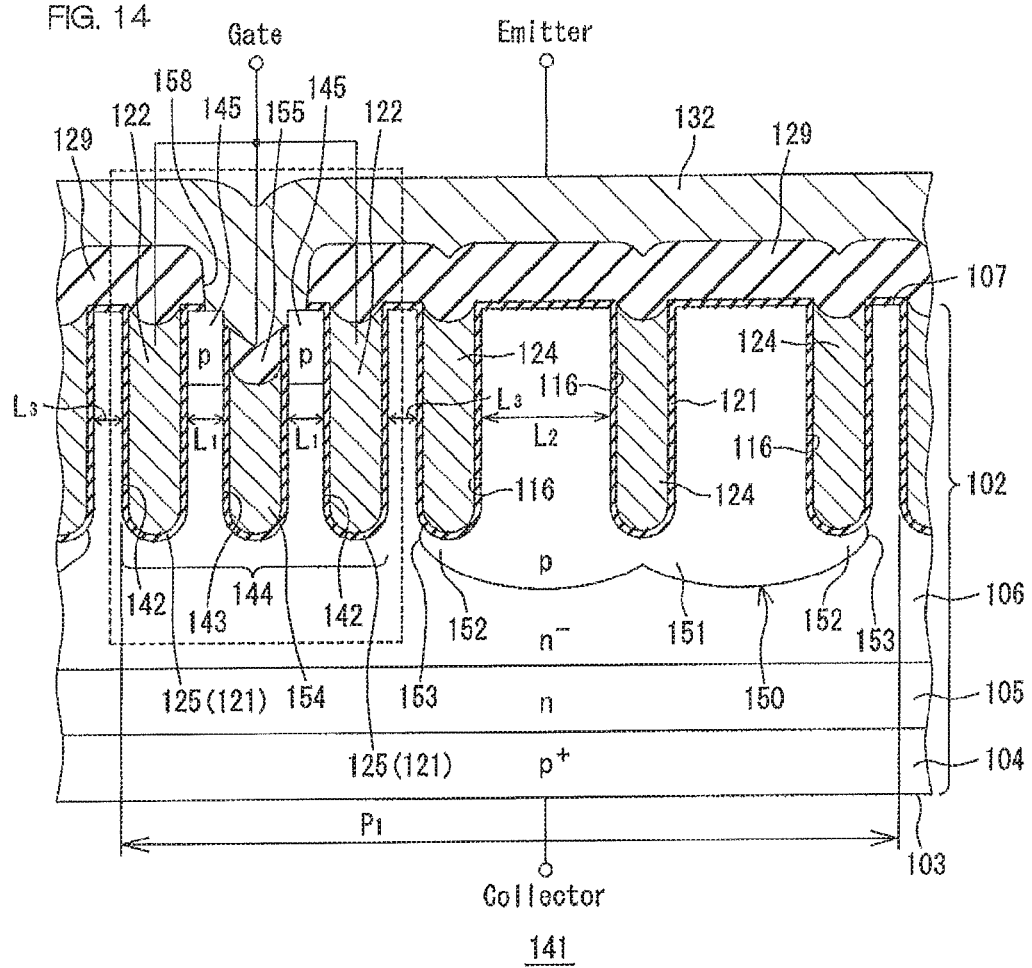

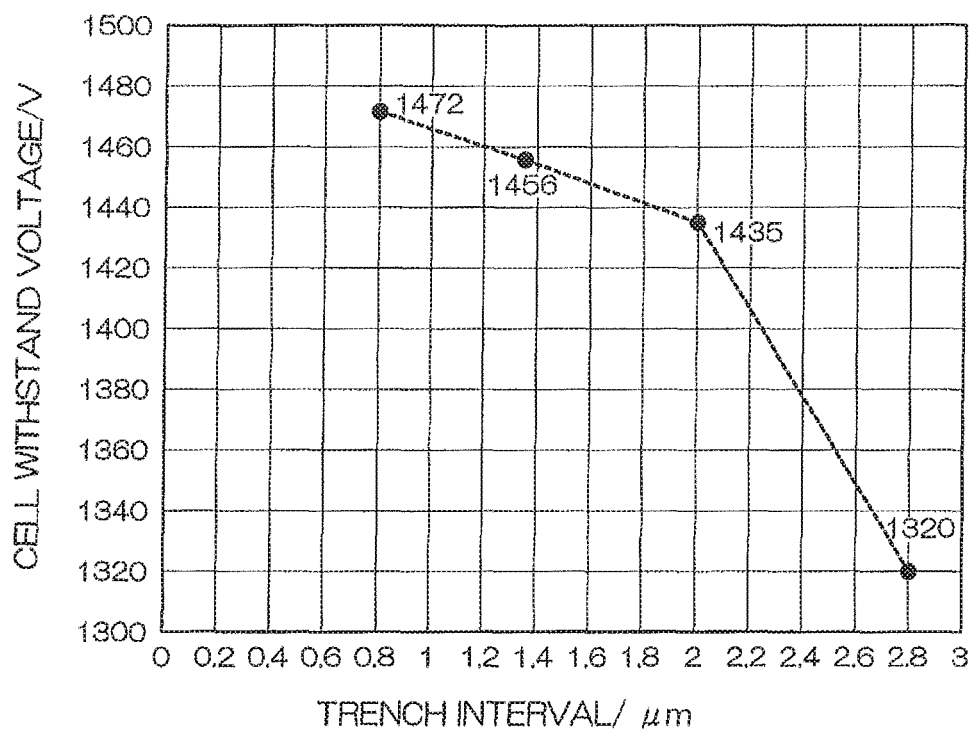

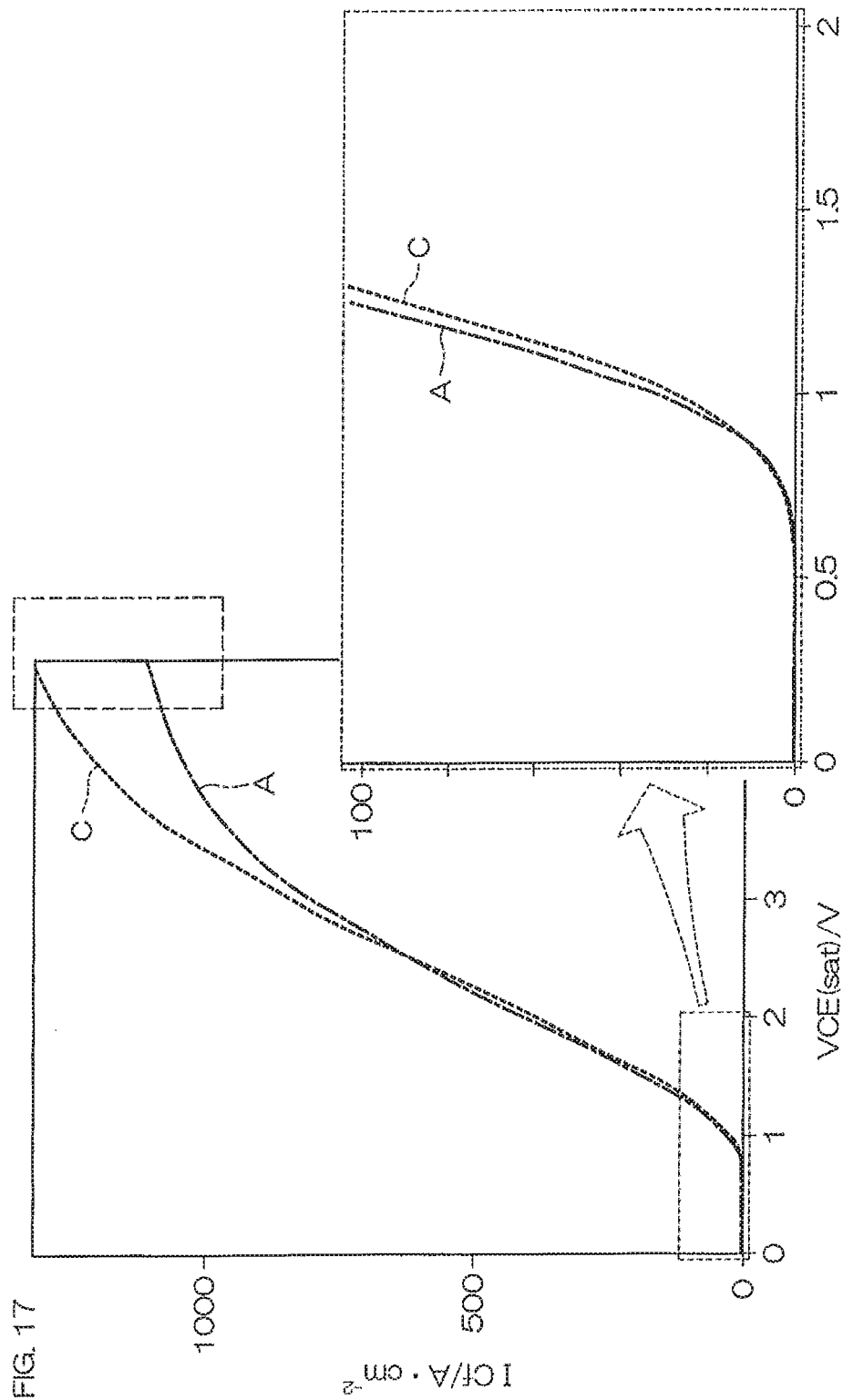

SEMICONDUCTOR DEVICE

CROSS-REFERENCE TO RELATED APPLICATION

This application is a continuation of U.S. application Ser. No. 14/630,697, filed on Feb. 25, 2015, and allowed on Nov. 16, 2015, which was a continuation of U.S. application Ser. No. 13/969,677, filed on Aug. 19, 2013, and issued as U.S. Pat. No. 8,994,102 on Mar. 31, 2015. Furthermore, this application claims the benefit of priority of Japanese applications 2012-182169, filed on Aug. 21, 2012, 2012-182168, filed on Aug. 21, 2012, and 2013-167477, filed on Aug. 12, 2013. The disclosures of these prior U.S. and Japanese applications are incorporated herein by reference.

TECHNICAL FIELD

The present invention relates to a semiconductor device including IGBTs (Insulated Gate Bipolar Transistors).

BACKGROUND ART

Conventionally, a trench-type IGBT having a high saturation voltage $V_{CE}$(sat) and short-circuit capacity between the collector and emitter has a p-type floating region. The p-type floating region is generally formed in a diffused manner in a drift layer so as to contact a gate junction trench. The drift layer is an epitaxial wafer or a pulled-up wafer having a resistance value comparable thereto.

SUMMARY OF INVENTION

However, the conventional structure has a high stray capacitance in a junction region between the gate junction trench and p-type floating region, and thus has a problem that operating noise and on-operation loss due to said stray capacitance occur when switched ON. Therefore, it has been difficult to establish low-noise and low-loss characteristics.

It is an object of the present invention to provide a semiconductor device including IGBTs capable of reducing generation of noise and switching loss at switching operation, and further capable of maintaining withstand voltage.

BRIEF DESCRIPTION OF DRAWINGS

FIG. 5 is a schematic sectional view of a semiconductor device according to a second embodiment of the present invention.

FIG. 6A is a view for explaining a manufacturing step of the semiconductor device of FIG. 5.

FIG. 6B is a view showing a following step of FIG. 6A.

FIG. 14 is a schematic sectional view of a semiconductor device according to a seventh embodiment of the present invention.

FIG. 16 is a graph showing a relationship between the trench interval and withstand voltage.

FIG. 17 is a graph showing $V_{CE}$-$I_{Cf}$ characteristics of devices.

DESCRIPTION OF EMBODIMENTS

Figure 1:
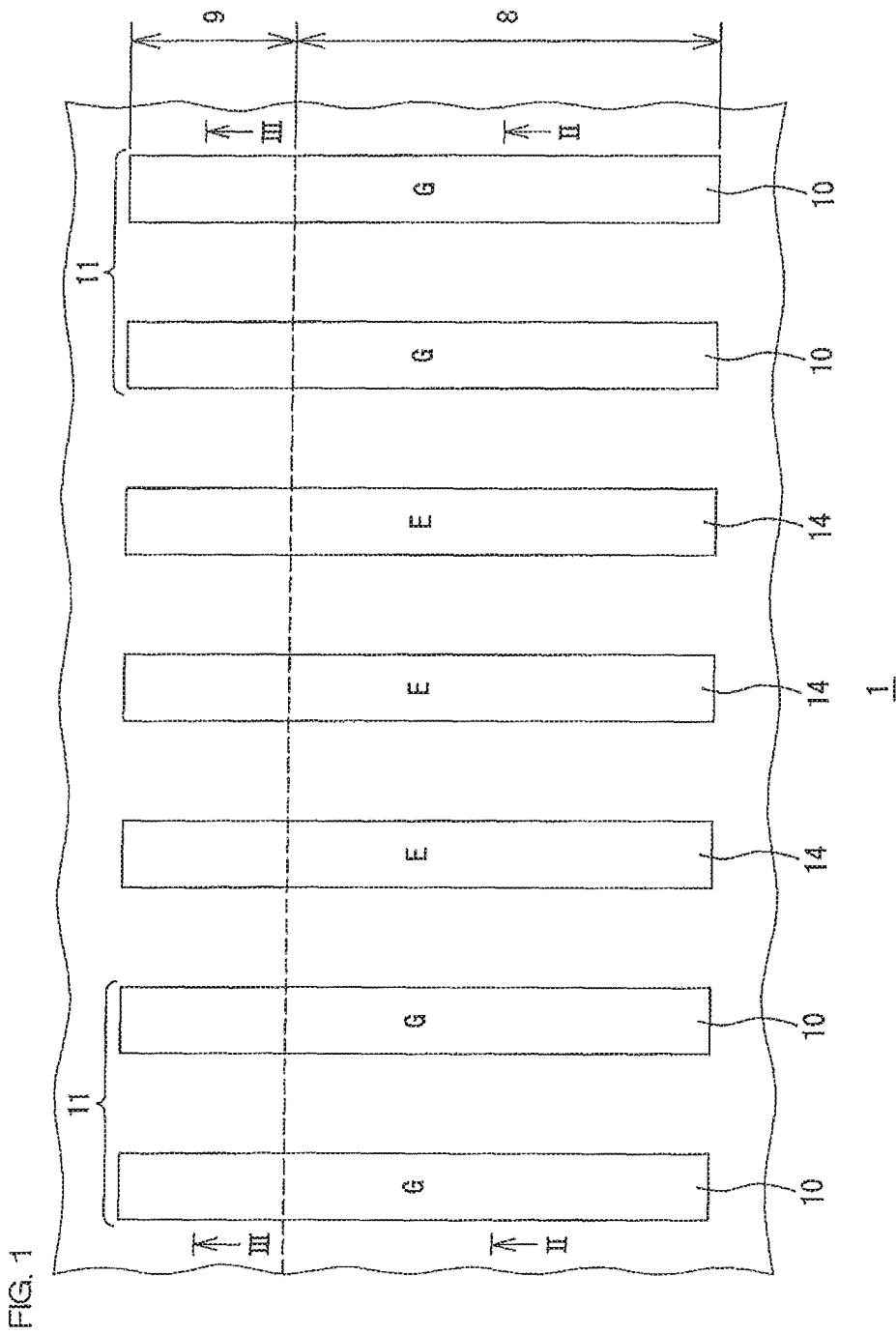
FIG. 1 is a schematic plan view of a semiconductor device according to a first embodiment of the present invention.

A semiconductor device of the present invention includes a semiconductor layer, a plurality of gate trenches formed in the semiconductor layer, a gate electrode filled via a gate insulating film in the plurality of gate trenches, an $n^+$-type emitter region, a p-type base region, and an $n^-$-type drift region disposed, lateral to each gate trench, in order in a depth direction of the gate trench from a front surface side of the semiconductor layer, a $p^+$-type collector region disposed on a back surface side of the semiconductor layer with respect to the $n^-$-type drift region, an emitter trench formed between the plurality of gate trenches adjacent to each other, and a buried electrode filled via an insulating film in the emitter trench, electrically connected with the $n^+$-type emitter region, and the emitter trench is disposed at an interval of 2 μm or less via an $n^-$-type drift region with the gate trench.

According to this arrangement, the gate trench filled with the gate electrode (hereinafter, referred to as a "gate junction trench") joins the $n^-$-type drift region. Therefore, even when there is formed a p-type floating region in the semiconductor layer, junction between said p-type floating region and the gate junction trench can be prevented. A stray capacitance between the gate junction trench and the p-type floating region can thereby be eliminated. On the other hand, the $n^-$-type drift region that joins the gate junction trench is to be grounded together with the $p^+$-type collector region. Therefore, at switching operation, a capacitance change between the gate junction trench and the n⁻-type drift region is stabilized, so that noise does not easily occur. As a result thereof, generation of noise and switching loss at switching operation can be reduced.

Also, because the interval between the emitter trench filled with the buried electrode (hereinafter, referred to as an "emitter junction trench") and the gate junction trench is 2 μm or less, withstand voltage can also be satisfactory maintained.

In addition, a p-type floating region may either be formed or not be formed in the semiconductor layer. However, when a p-type floating region is formed in the semiconductor layer where the emitter trench is formed in plural numbers, it is preferable that said p-type floating region is formed between the plurality of emitter trenches. That is, it is preferable that a p-type floating region is formed within a region sandwiched by emitter junction trenches closest to the gate junction trenches.

The p-type floating region may be formed at the same depth as that of the p-type base region. In this case, because the p-type floating region may be formed by the same step as that for the p-type base region, the manufacturing process can be simplified.

On the other hand, the p-type floating region may be formed deeper than the p-type base region. In this case, the p-type floating region preferably includes an overlap portion that goes around to a lower side of an emitter trench closest to the gate trench out of the plurality of emitter trenches.

According to this arrangement, because the p-type floating region (overlap portion) is formed up to a bottom portion of the emitter junction trench, a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region that is deeper than the p-type base region, while the p-type base region may be shallow, the channel length can also be reduced to suppress a rise in ON-voltage by appropriately designing the depth of the p-type base region.

The overlap portion preferably has an end portion positioned on a side closer to the gate trench with respect to a center in a width direction of the emitter trench.

According to this arrangement, a collector-emitter voltage to be applied to the emitter junction trench can be more satisfactorily relieved.

Also, it is preferable that the semiconductor device includes an active region set on the semiconductor layer and a non-active region adjacent to the active region, and a contact portion disposed, in the non-active region, on the semiconductor layer so as to extend across the buried electrodes filled in the plurality of emitter trenches, for collectively connecting to the plurality of buried electrodes.

According to this arrangement, disposing the contact portion in the non-active region allows forming a relatively thick insulating film on the front surface of the semiconductor layer in the active region. Therefore, insulation breakdown in the active region can be prevented.

The plurality of emitter trenches may be disposed at an interval of 3 μm or less from each other.

Also, the emitter trench is preferably formed at the same depth as that of the gate trench. In this case, the emitter trench is formed by the same step as that for the gate trench, the manufacturing process can be simplified.

Also, the gate trenches may be disposed one pair each in a transverse direction along the front surface of the semiconductor layer, and the pair of gate trenches may be opposed in the transverse direction via the p-type base region that is common thereto. In this case, one of the pair of gate trenches may be disposed at an interval of 2 μm to 7 μm with respect to the other.

The n⁺-type emitter region may have an n-type dopant concentration of $1 \times 10^{19}$ cm⁻³ to $5 \times 10^{20}$ cm⁻³. The p-type base region may have a p-type dopant concentration of $1 \times 10^{16}$ cm⁻³ to $1 \times 10^{18}$ cm⁻³. The n⁻-type drift region may have an n-type dopant concentration of $1 \times 10^{13}$ cm⁻³ to $5 \times 10^{14}$ cm⁻³. The p⁺-type collector region may have a p-type dopant concentration of $1 \times 10^{15}$ cm⁻³ to $2 \times 10^{19}$ cm⁻³.

Also, the n⁺-type emitter region preferably selectively has a pullout portion pulled out in a transverse direction along the front surface of the semiconductor layer from a side surface of the gate trench.

Also, the semiconductor device preferably includes a dummy trench formed spaced at a predetermined interval lateral to the gate trench so that the n⁺-type emitter region, the p-type base region, and the n⁻-type drift region are formed between the dummy trench and the gate trench, a buried insulating film being a buried insulating film filled in the dummy trench and having an upper surface on a bottom side of the dummy trench with respect to the front surface of the semiconductor layer, for selectively exposing as a contact region a part of the p-type base region at a part from the front surface to the upper surface in a side surface of the dummy trench, and a contact electrode filled in a region over the buried insulating film of the dummy trench, connected to the contact region on the side surface of the dummy trench.

According to this arrangement, because the side surface of the dummy trench can be effectively used as the contact region, a junction area of the contact electrode with respect to the p-type base region can be sufficiently secured. Because a plane area of the p-type base region can thereby be sacrificed, the interval between the gate trench and the dummy trench can be miniaturized to form a p-type base region more minute than the conventional p-type base region. Furthermore, because the dummy trench can be formed using the same mask as that for the gate trench, misalignment with respect to the gate trench does not occur. Moreover, alignment of the contact electrode, for which alignment with an area including a plane area of the dummy trench suffices, can thus be easily attained.

Also, as a result of miniaturization of the trench structure, a trade-off relationship between the short-circuit capacity and ON-voltage of the device can be improved, so that a charge enhancement effect can be increased. $V_{CE}(\text{sat})$ in a low-current range can hence be improved.

The semiconductor device may further include a first buried electrode filled via an insulating film in a region under the buried insulating film of the dummy trench.

Also, the semiconductor device may have a trench unit including a pair of the dummy trenches and a gate trench sandwiched between the pair of dummy trenches.

Also, the dummy trench preferably serves also as the emitter trench as a result of the first buried electrode being electrically connected with the n⁺-type emitter region.

Also, the semiconductor device may have a trench unit including a pair of the gate trenches and a dummy trench sandwiched between the pair of gate trenches. In this case, the first buried electrode is preferably electrically connected with the gate electrode.

Also, the buried insulating film preferably has a thickness of 0.5 μm or more.

Hereinafter, embodiments of the present invention will be described in detail with reference to the accompanying drawings.

Figure 2:
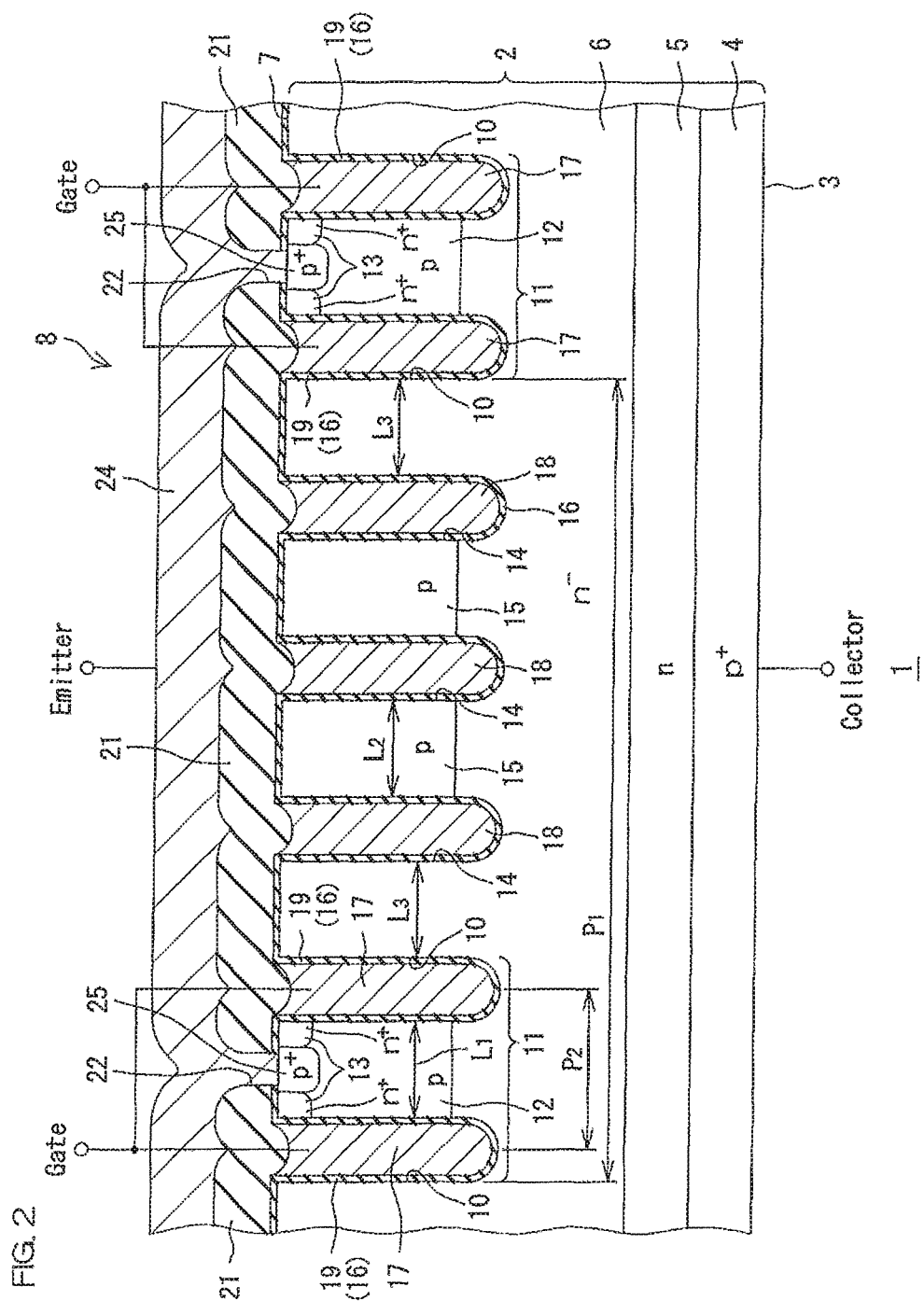
FIG. 2 is a sectional view from a section II-II of FIG. 1.
Figure 3:
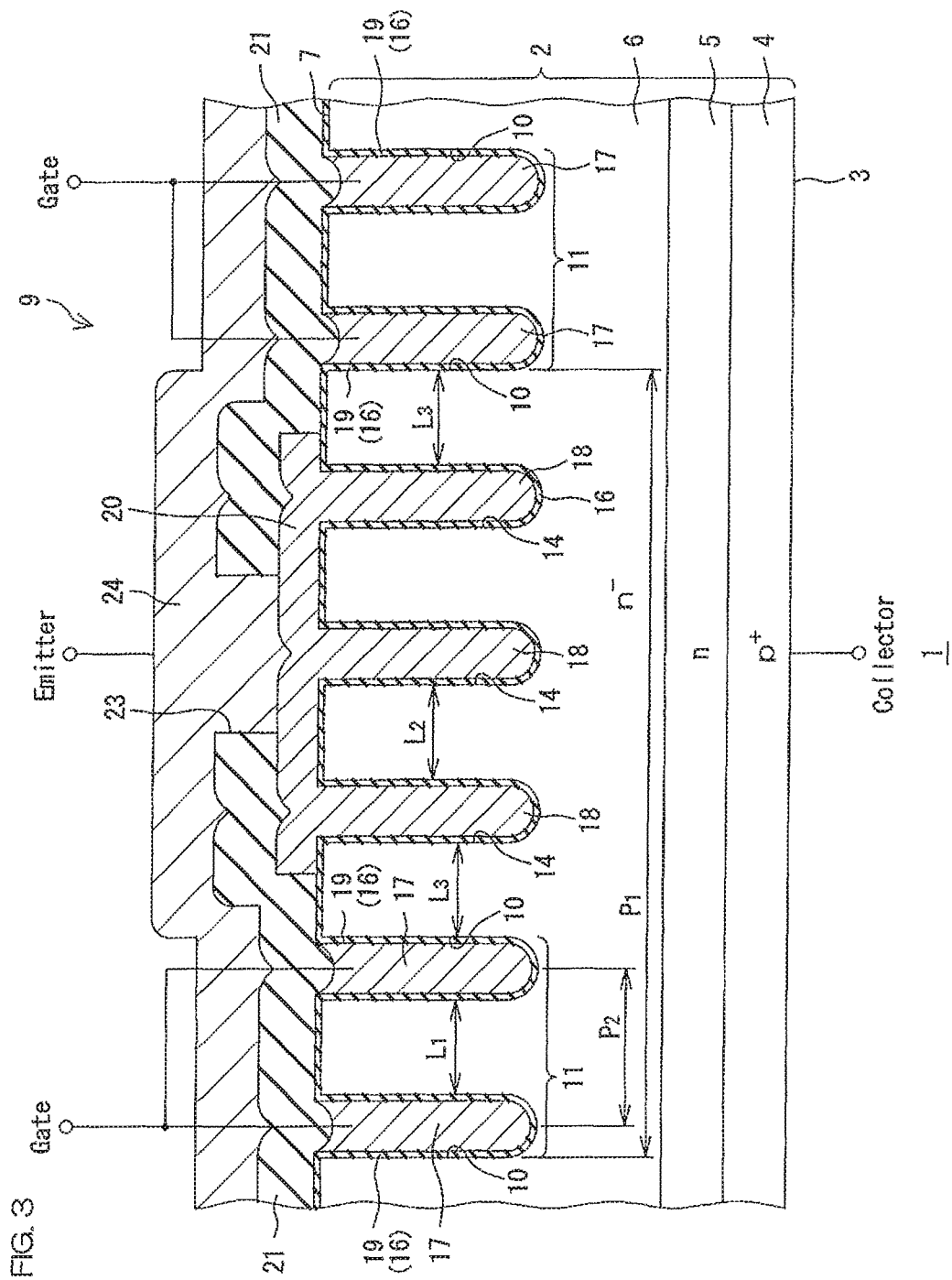
FIG. 3 is a sectional view from a section III-III of FIG. 1.
Figure 4A:
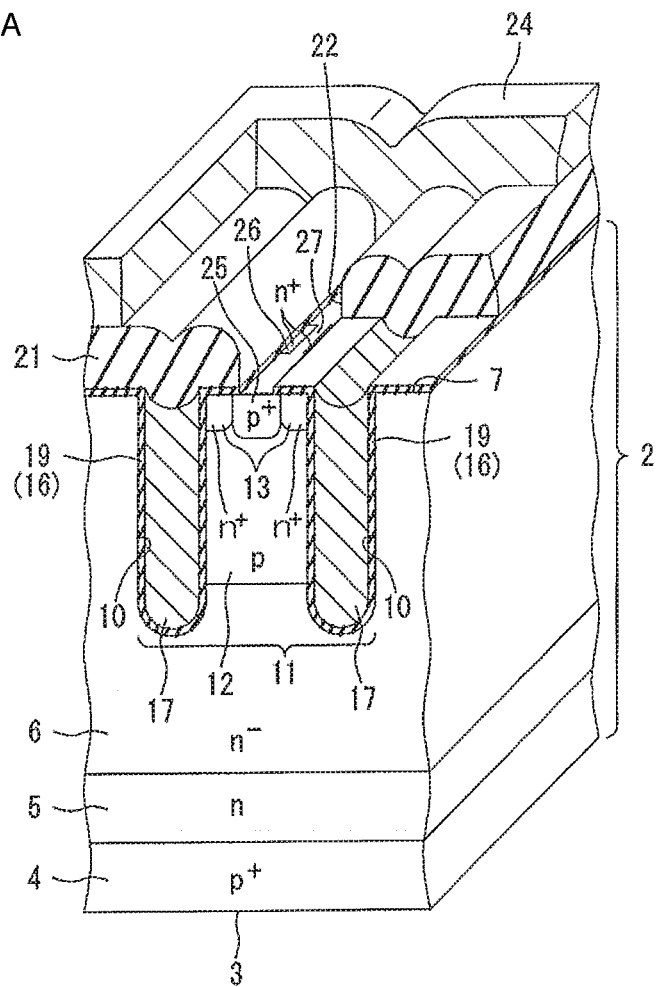
FIG. 4A shows a perspective view explaining an internal structure of the semiconductor device of FIG. 1.
Figure 4B:
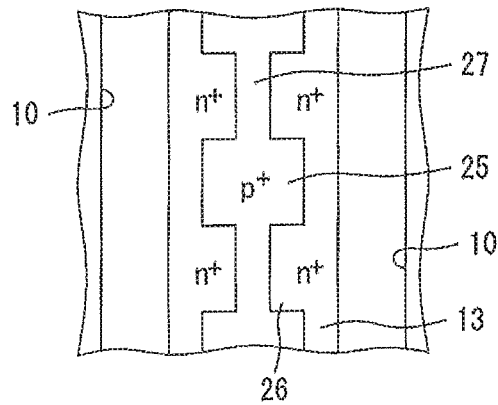
FIG. 4B shows a plan view explaining an internal structure of the semiconductor device of FIG. 1

FIG. 1 is a schematic plan view of a semiconductor device 1 according to a first embodiment of the present invention. FIG. 2 is a sectional view from a section II-II of FIG. 1. FIG. 3 is a sectional view from a section III-III of FIG. 1. FIGS. 4A and 4B are views for explaining an internal structure of the semiconductor device of FIG. 1, wherein FIG. 4A shows a perspective view, and FIG. 4B shows a plan view.

The semiconductor device 1 is a device including IGBTs, and includes a semiconductor substrate 2 as an example of a semiconductor layer of the present invention. The semiconductor layer 2 may be, for example, an n$^-$-type silicon substrate having a thickness of 50 μm to 200 μm.

The semiconductor substrate 2 has a structure in which a p$^+$-type collector region 4, an n-type buffer region 5, and an n$^-$-type drift region 6 are stacked in order from the side of its back surface 3. The p$^+$-type collector region 4 is exposed over the entire back surface 3 of the semiconductor substrate 2, and the n$^-$-type drift region 6 is selectively exposed on a part of a front surface 7 of the semiconductor substrate 2.

As a p-type dopant of the p$^+$-type collector region 4, for example, B (boron), Al (aluminum), and others can be used (the same applies to the following). On the other hand, as an n-type dopant of the n-type buffer region 5 and the n$^-$-type drift region 6, for example, N (nitrogen), P (phosphorus), As (arsenic), and others can be used (the same applies to the following).

Also, the dopant concentration of the p$^+$-type collector region 4 is, for example, $1\times10^{15}$ cm$^{-3}$ to $2\times10^{19}$ cm$^{-3}$. On the other hand, the dopant concentration of the n-type buffer region 5 is, for example, $1\times10^{15}$ cm$^{-3}$ to $5\times10^{17}$ cm$^{-3}$, and the dopant concentration of the n$^-$-type drift region 6 is $1\times10^{13}$ cm$^{-3}$ to $5\times10^{14}$ cm$^{-3}$.

On the front surface 7 of the semiconductor substrate 2, an active region 8 and a non-active region 9 are set adjacent to each other.

On the side of the front surface 7 of the semiconductor substrate 2, a plurality of gate trenches 10 extending across the active region 8 and the non-active region 9 are formed. In the present embodiment, the plurality of gate trenches 10 are formed in a form of stripes that run across a boundary between the active region 8 and the non-active region 9, and disposed as trench units 11 of one pair each in the transverse direction along the front surface 7 of the semiconductor substrate 2. The pitch P$_1$ of mutually adjacent trench units 11 is, for example, 4 μm to 20 μm. Also, in a pair of gate trenches 10, the pitch P$_2$ of one gate trench 10 and the other gate trench 10 (distance of center points of the gate trenches 10) is, for example, 2 μm to 7 μm, and the interval L$_1$ (distance between side surfaces of the gate trenches 10) is, for example, 1 μm to 6 μm.

Between a pair of gate trenches 10 in the active region 8, a p-type base region 12 is formed, and further, an n$^+$-type emitter region 13 is formed in a front surface portion of the p-type base region 12. The p-type base region 12 is shared by one gate trench 10 and the other gate trench 10. On the other hand, n$^+$-type emitter regions 13 are formed one each along side surfaces of one and the other gate trenches 10, and exposed on the front surface 7 of the semiconductor substrate 2. Also, in the front surface portion of the p-type base region 12, a p$^+$-type base contact region 25 is formed so as to be sandwiched by the pair of n$^+$-type emitter regions 13. The dopant concentration of the p$^+$-type base contact region 25 is, for example, $5\times10^{18}$ cm$^{-3}$ to $1\times10^{20}$ cm$^{-3}$.

The n$^+$-type emitter region 13, as shown in FIGS. 4A and 4B, selectively has a pullout portion 26 pulled out in the transverse direction along the front surface 7 of the semiconductor substrate 2 from the side surface of the gate trench 10. The pullout portion 26 is, for example, disposed spaced at fixed intervals along the longitudinal direction of the gate trench 10. When a pair of n$^+$-type emitter regions 13 are provided as in the present embodiment, the pullout portions 26 of the respective n$^+$-type emitter regions 13 may be, as shown in FIG. 4B, disposed so that one and the other end portions are opposed to each other, or end portions of one pullout portion 26 and end portions of the other pullout portion 26 may be disposed alternately along the longitudinal direction of the gate trench 10 (not shown). In the former case of an opposing arrangement, a part sandwiched by the pullout portions 26 in the p$^+$-type base contact region 25 serves as a constricted portion 27 selectively having a narrower width than that of the remaining part.

Also, in the present embodiment, an interface between the p-type base region 12 and the n$^-$-type drift region 6 is set in a bottom portion of the gate trenches 10, so that the p-type base region 12 is formed by diffusion up to a relatively deep position of the semiconductor substrate 2.

Also, the dopant concentration of the p-type base region 12 is, for example, $1\times10^{16}$ cm$^{-3}$ to $1\times10^{18}$ cm$^{-3}$, the dopant concentration of the n$^+$-type emitter region 13 is $1\times10^{19}$ cm$^{-3}$ to $5\times10^{20}$ cm$^{-3}$.

Also, between a pair of gate trenches 10 on the side of the front surface 7 of the semiconductor substrate 2, a plurality of (in FIG. 1 to FIG. 3, three) emitter trenches 14 extending across the active region 8 and the non-active region 9 are formed. In the present embodiment, the plurality of emitter trenches 14 are formed in a form of stripes that run across a boundary between the active region 8 and the non-active region 9 (parallel to the gate trenches 10), and disposed spaced at mutually equal intervals in the transverse direction along the front surface 7 of the semiconductor substrate 2. The interval L$_2$ of mutually adjacent emitter trenches 14 (distance between side surfaces of the emitter trenches 14) is, for example, 3 μm or less, and preferably, 0.8 μm to 3 μm. Also, the plurality of emitter trenches 14 are formed at the same depth as that of the gate trenches 10. Because the emitter trenches 14 and the gate trenches 10 can thereby be formed by the same step, the manufacturing process can be simplified.

Out of the plurality of emitter trenches 14, a trench that is adjacent to the gate trench 10 (trench that is opposed to the gate trench 10 via no trench therewith) is disposed at an interval L$_3$ (distance between the side surface of the emitter trench 14 and the side surface of the gate trench 10) of 2 μm or less via the n$^-$-type drift region 6 with the gate trench 10. That is, between said emitter trench 14 and the gate trench 10, the n$^-$-type drift region 6 is interposed across the entire area in the depth direction.

Also, in each section between the plurality of emitter trenches 14 in the active region 8, a p-type floating region 15 is formed. The p-type floating region 15 is a semiconductor region where a floating state is electrically maintained, and is separated from the gate trench 10 by the emitter trench 14 that is adjacent to the gate trench 10. The p-type floating region 15 is, in the present embodiment, formed at the same depth as that of the p-type base region 12. That is, an interface between the p-type floating region 15 and the n$^-$-type drift region 6 is set in a bottom portion of the emitter trenches 14, so that the p-type floating region 15 is formed by diffusion up to a relatively deep position of the semiconductor substrate 2. Because the p-type base regions 12 and the p-type floating regions 15 can thereby be formed by the same step, the manufacturing process can be simplified.

Also, the dopant concentration of the p-type floating region 15 is, for example, $5\times10^{15}$ cm$^{-3}$ to $1\times10^{18}$ cm$^{-3}$.

On the other hand, in the non-active region 9, for either a region between a pair of gate trenches 10 or a region in each section between the plurality of emitter trenches 14, the n⁻-type drift region 6 extends across its entire area.

In the gate trenches 10 and the emitter trenches 14, gate electrodes 17 and buried electrodes 18 are filled, respectively, via an insulating film 16 (for example, silicon oxide (SiO₂)). The gate electrodes 17 and the buried electrodes 18 are made of, for example, a conductive material such as polysilicon. The insulating film 16 is integrally formed along inner surfaces of the gate trenches 10, the front surface 7 of the semiconductor substrate 2, and inner surfaces of the emitter trenches 14. The part of the insulating film 16 in the gate trench 10 serves as a gate insulating film 19. Also, a plurality of buried electrodes 18 of the emitter trenches 14 are, in the non-active region 9, connected collectively by a contact portion 20. The contact portion 20 is disposed extending across the plurality of buried electrodes 18 in a direction to run across the plurality of emitter trenches 14.

On the front surface 7 of the semiconductor substrate 2, an interlayer film 21 made of, for example, an insulating material such as boron phosphorus silicate glass (BPSG) or silicon oxide (SiO₂) is stacked. In the interlayer film 21, a contact hole 22 is formed to selectively expose the n⁺-type emitter region 13 and the p⁺-type base contact region 25 in the active region 8. The n⁺-type emitter region 13 is selectively exposed at the pullout portion 26 from the contact hole 22. Also, in the interlayer film 21, a contact hole 23 is formed to selectively expose the contact portion 20 in the non-active region 9.

On the interlayer film 21, an emitter electrode 24 is stacked. The emitter electrode 24 is connected to the p⁺-type base contact region 25 and the n⁺-type emitter region 13 and the contact portion 20 via the contact holes 22 and 23, respectively. The buried electrodes 18 in the emitter trenches 14 are to be connected to the emitter electrode 24 via the contact portion 20.

According to the semiconductor device 1, the gate trench 10 filled with the gate electrode 17 (hereinafter, referred to as a "gate junction trench") is separated from the p-type floating region 15 by the emitter trench 14 filled with the buried electrode 18 (hereinafter, referred to as an "emitter junction trench"). The p-type floating region 15 and the gate junction trench can thereby be prevented from joining. A stray capacitance between the gate junction trench and the p-type floating region 15 can therefore be eliminated.

On the other hand, the n⁻-type drift region 6 which the gate junction trench joins across the entire area in the depth direction is to be grounded together with the p⁺-type collector region 4. Therefore, at switching operation, a capacitance change between the gate junction trench and the n⁻-type drift region 6 is stabilized, so that noise does not easily occur. As a result thereof, generation of noise and switching loss at switching operation can be reduced.

Also, because the interval $L_3$ between the emitter junction trench and the gate junction trench is 2 μm or less, withstand voltage can also be satisfactorily maintained.

Also, in this semiconductor device 1, disposing the contact portion 20 in the non-active region 9 allows interposing the relatively thick interlayer 21 between the emitter electrode 24 and the semiconductor substrate 2 in the active region 8. Therefore, insulation breakdown in the active region 8 can be prevented.

FIG. 5 is a schematic sectional view of a semiconductor device 41 according to a second embodiment of the present invention. In FIG. 5, parts corresponding to the respective portions shown in FIG. 2 and FIG. 3 described above will be denoted by the same reference signs.

In the foregoing first embodiment, an interface between the p-type base region 12 and the n⁻-type drift region 6 is set in a bottom portion of the gate trenches 10, so that the p-type base region 12 is formed by diffusion up to a relatively deep position of the semiconductor substrate 2. In contrast, in the semiconductor device 41 of the second embodiment, an interface between a p-type base region 42 and the n⁻-type drift region 6 is set in a central portion or upper portion of the gate trenches 10, so that the p-type base region 42 is formed by diffusion at a relatively shallow position of the semiconductor substrate 2.

Also, the semiconductor device 41 includes a p-type floating region 43 formed deeper than the p-type base region 42 in each section between the plurality of emitter trenches 14. The p-type floating region 43 has a bottom portion 44 that bulges to the side of the back surface 3 of the semiconductor substrate 2 with respect to a bottom portion of the emitter trenches 14 and an overlap portion 45 that goes around to the lower side of the emitter trench 14 adjacent to the gate trench 10. The overlap portion 45 has an end portion 46 positioned on a side closer to the gate trench 10 with respect to the center in the width direction of said emitter trench 14. The end portion 46 is preferably not projecting to the side of the gate trench 10 with respect to the emitter trench 14.

Next, a manufacturing method of the semiconductor device 41 will be explained. FIG. 6A to FIG. 6G are views for explaining the manufacturing process of the semiconductor device 41 of FIG. 5 in the order of steps.

For manufacturing the semiconductor device 41, as shown in FIG. 6A, a mask 47 is formed on the front surface 7 of the n⁻-type semiconductor substrate 2 (n⁻-type drift region 6). In the mask 47, there is formed an opening to selectively expose a region that needs to be formed into the p-type floating region 43 in the front surface 7. Then, via the mask 47, a p-type dopant is ion-implanted into the front surface 7 of the semiconductor substrate 2. An ion-implanted region 48 is thereby formed.

Next, as shown in FIG. 6B, by the semiconductor substrate 2 being selectively etched, the gate trenches 10 and the emitter trenches 14 are simultaneously formed.

Figure 6C:
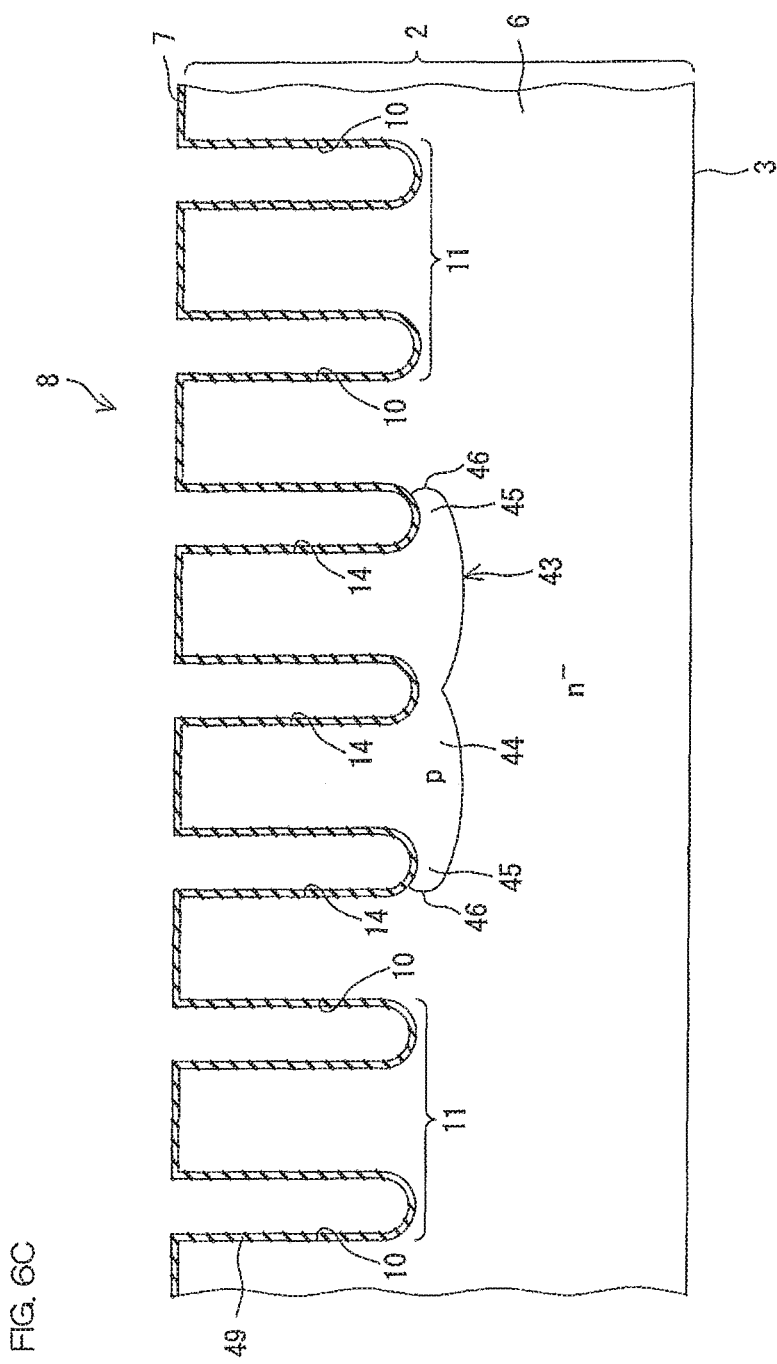
FIG. 6C is a view showing a following step of FIG. 6B.

Next, as shown in FIG. 6C, by the semiconductor substrate 2 being thermally oxidized, a sacrificial oxide film 49 is formed on the entire area of the front surface including the inner surfaces of the gate trenches 10 and the emitter trenches 14. Then, by annealing the semiconductor substrate 2 covered with the sacrificial oxide film 49, the p-type dopant in the ion-implanted region 48 is diffused (driven in). The annealing treatment is performed on a condition that the p-type dopant goes around to the lower side of the emitter trench 14. The p-type floating region 43 is thereby formed. In this case, because the semiconductor substrate 2 is covered with the sacrificial oxide film 49, ion seeping from the front surface of the substrate can be prevented, so that the p-type dopant can be efficiently diffused.

Figure 6D:
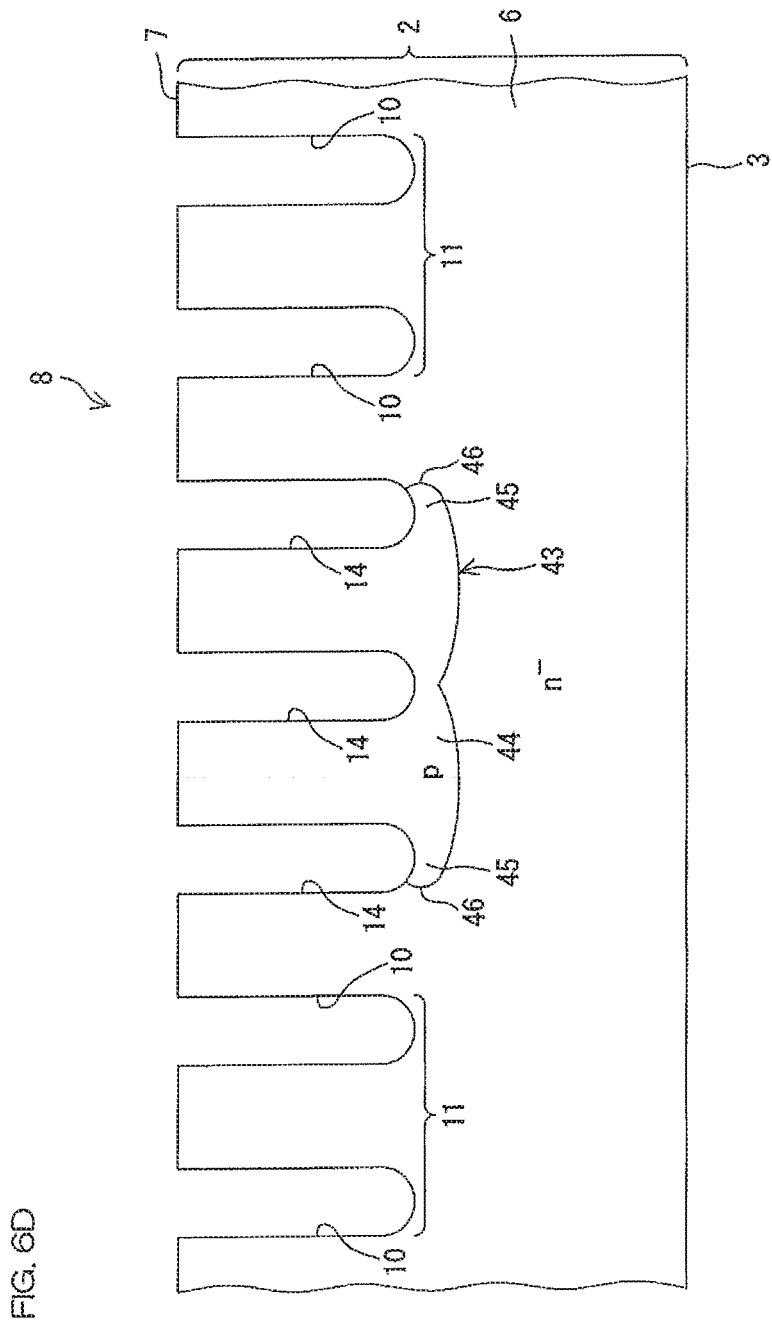
FIG. 6D is a view showing a following step of FIG. 6C.

Next, as shown in FIG. 6D, the sacrificial oxide film 49 is stripped.

Figure 6E:
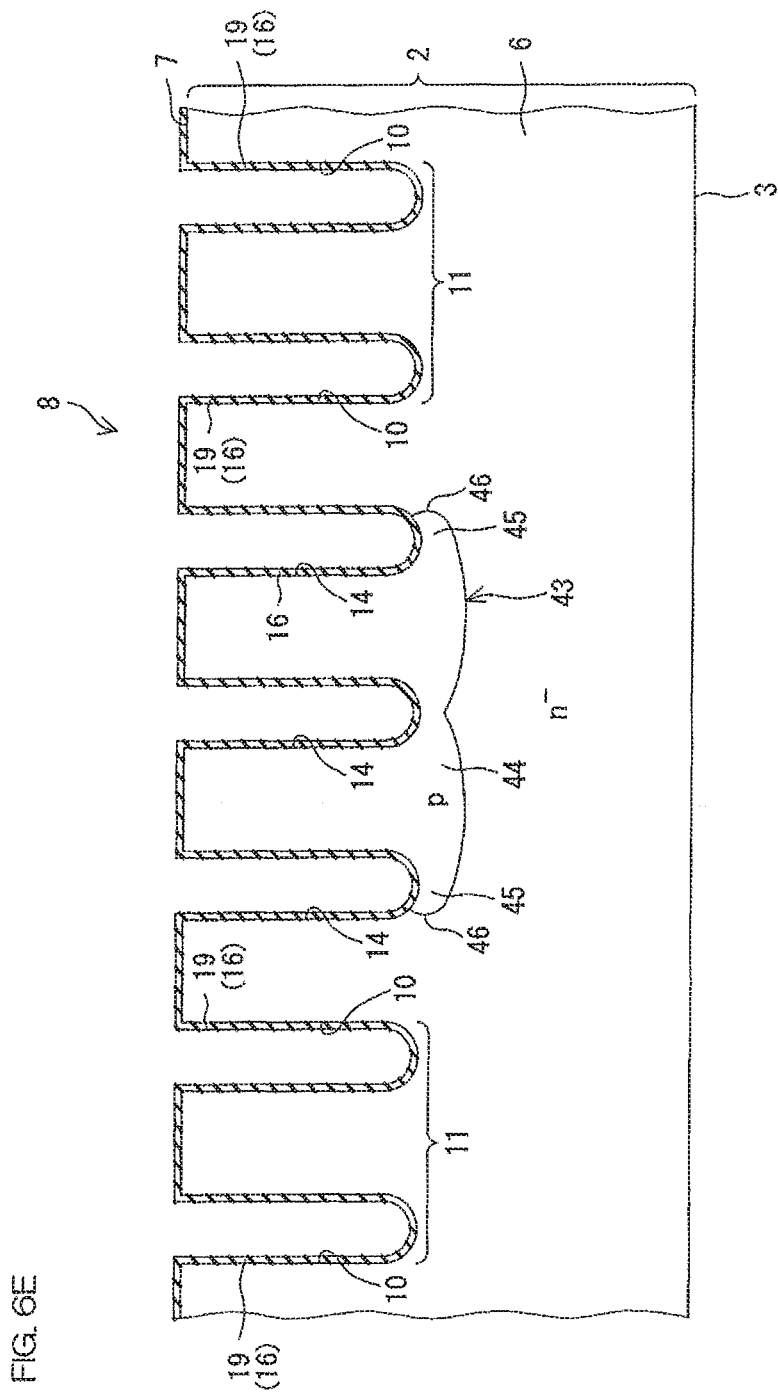
FIG. 6E is a view showing a following step of FIG. 6D.

Next, as shown in FIG. 6E, by the semiconductor substrate 2 being thermally oxidized, the insulating film 16 (gate insulating film 19) is formed on the entire area of the front surface including the inner surfaces of the gate trenches 10 and the emitter trenches 14.

Figure 6F:
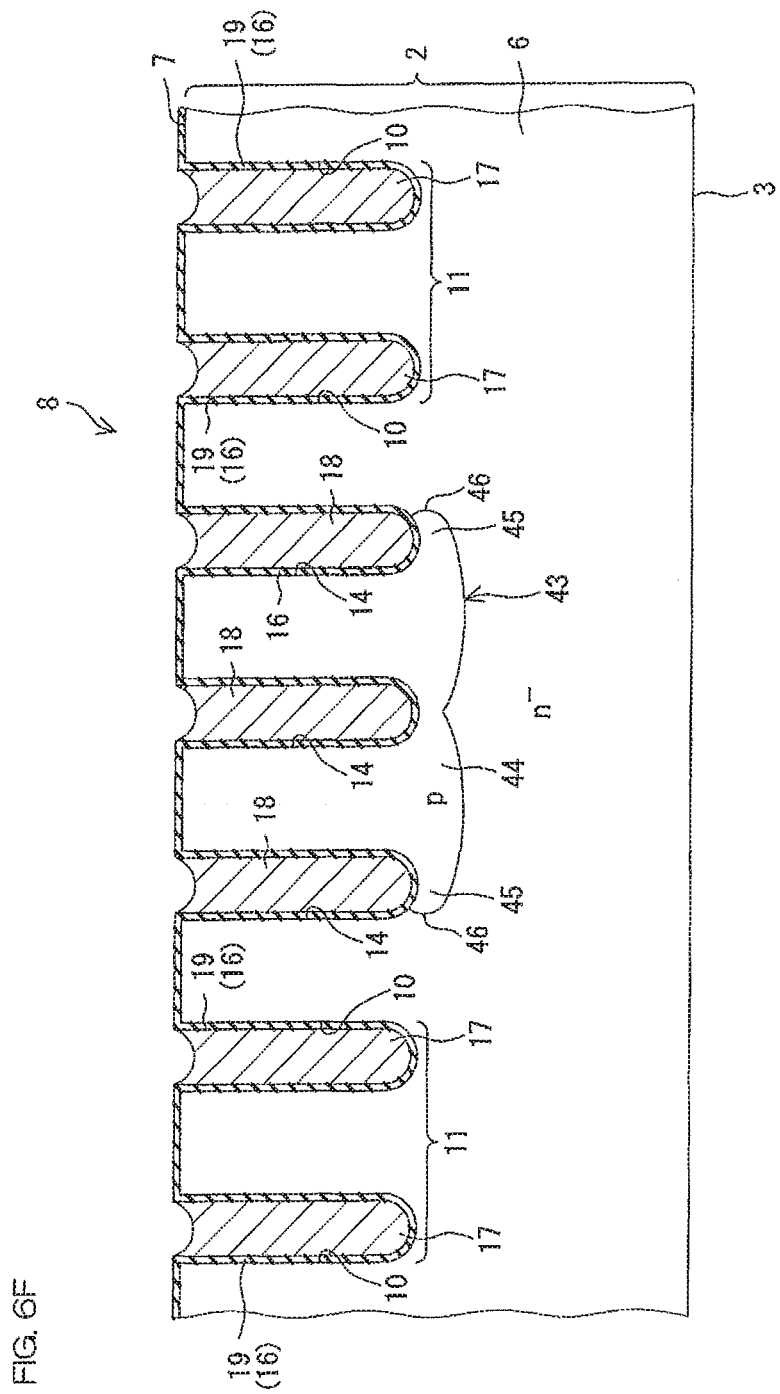
FIG. 6F is a view showing a following step of FIG. 6E.

Next, as shown in FIG. 6F, an electrode material such as polysilicon is filled in the gate trenches 10 and the emitter trenches 14. The gate electrodes 17 and the buried electrodes 18 are simultaneously formed.

Figure 6G:
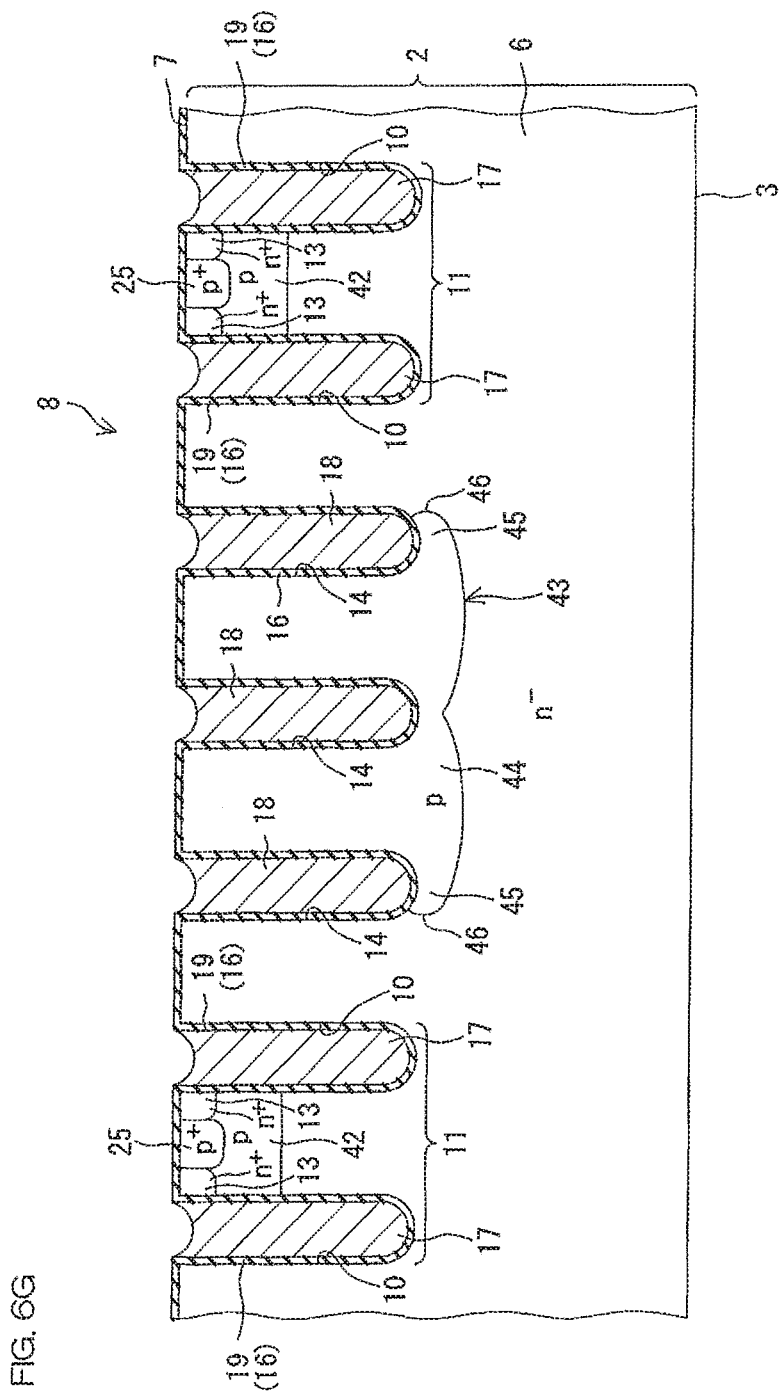
FIG. 6G is a view showing a following step of FIG. 6F.

Next, as shown in FIG. 6G, by n-type and p-type dopants being selectively ion-implanted and diffused into the front surface 7 of the semiconductor substrate 2, the p-type base regions 42, the n⁺-type emitter regions 13, and the p⁺-type base contact regions 25 are thereby formed in order.

Thereafter, by n-type and p-type dopants being selectively ion-implanted and diffused into the back surface 3 of the semiconductor substrate 2 after the interlayer film 21 and the emitter electrode 24 and the like being formed on the side of the front surface 7 of the semiconductor substrate 2, the n-type buffer region 5 and the p⁺-type collector region 4 are formed in order.

Through the steps as above, the semiconductor device 41 shown in FIG. 5 is obtained. However, FIG. 6A to FIG. 6G merely represent a part of the manufacturing process of the semiconductor device 41, and said manufacturing process may include steps not shown by FIG. 6A to FIG. 6G.

According to this semiconductor device 41, because the p-type floating region 43 (overlap portion 45) is formed up to a bottom portion of the emitter junction trench, a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region 43 that is deeper than the p-type base region 42, while the p-type base region 42 may be shallow, the channel length (length in the depth direction of the gate trench 10) can also be reduced to suppress a rise in ON-voltage by appropriately designing the depth of the p-type base region 42.

Of course, the same effects as those of the semiconductor device 1 of the first embodiment can also be achieved.

Figure 7:
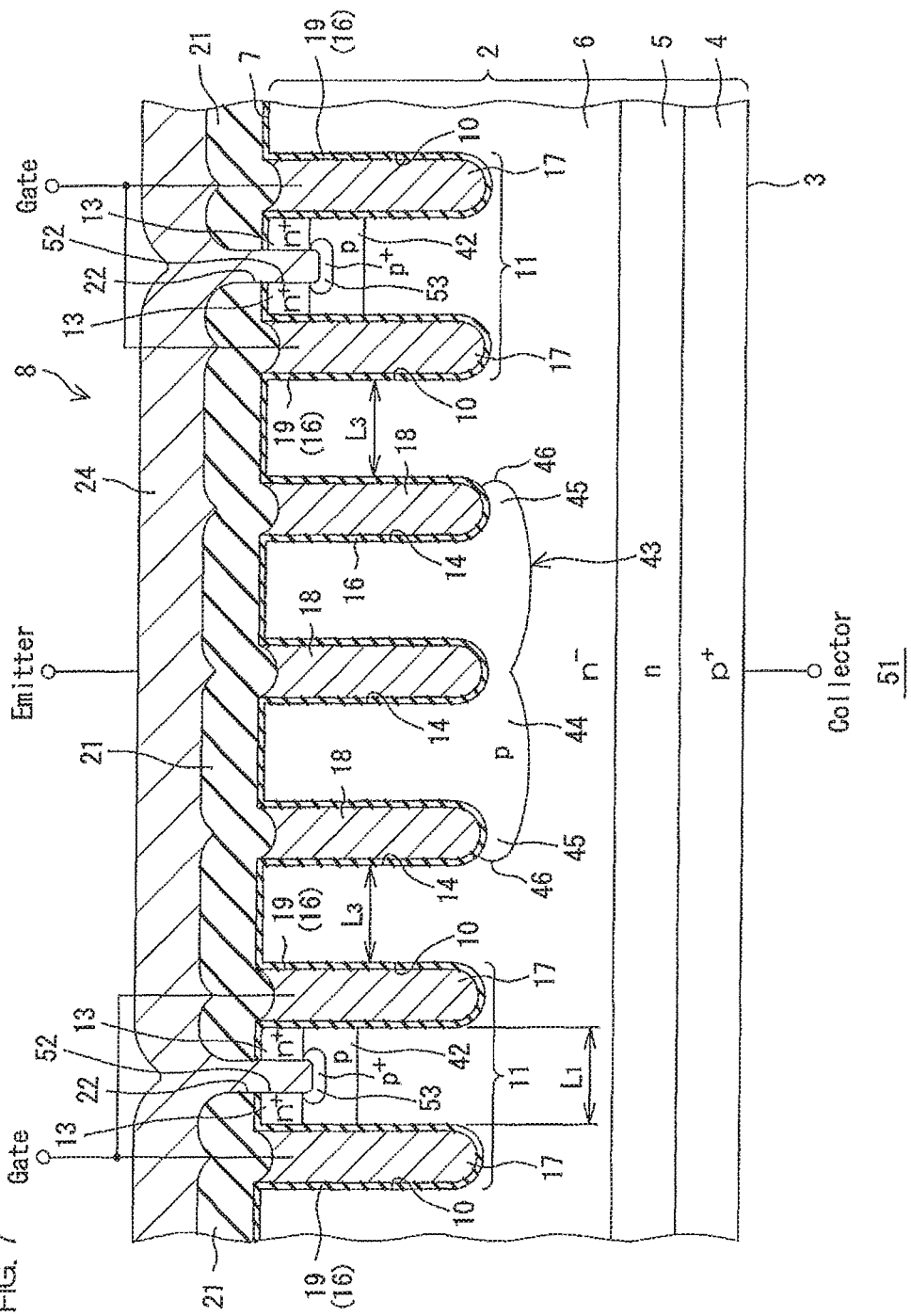
FIG. 7 is a schematic sectional view of a semiconductor device according to a third embodiment of the present invention.
Figure 8:
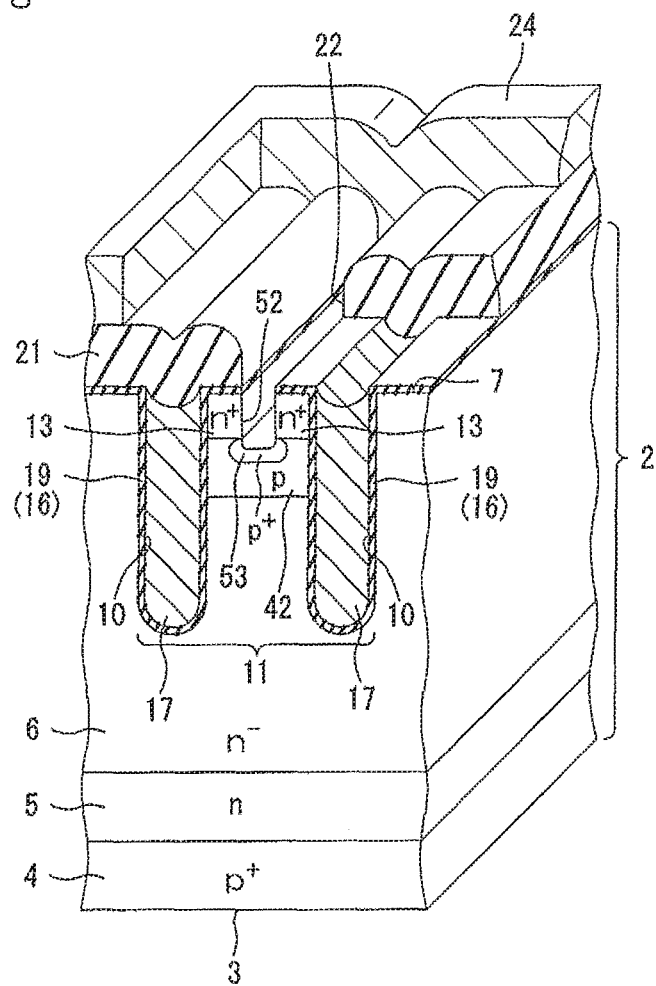
FIG. 8 is a perspective view for explaining an internal structure of the semiconductor device of FIG. 7.

FIG. 7 is a schematic sectional view of a semiconductor device 51 according to a third embodiment of the present invention. FIG. 8 is a perspective view for explaining an internal structure of the semiconductor device 51 of FIG. 7. In FIG. 7 and FIG. 8, parts corresponding to the respective portions shown in FIG. 2 to FIG. 5 described above will be denoted by the same reference signs.

In the foregoing first and second embodiments, the emitter electrode 24 is connected to the p⁺-type base contact regions 25 and the n⁺-type emitter regions 13 on the front surface 7 of the semiconductor substrate 2. In contrast, the semiconductor device 51 of the third embodiment further includes a contact trench 52 formed penetrating through the n⁺-type emitter regions 13 from the front surface 7 of the semiconductor substrate 2 in the p-type base region 42 and a p⁺-type base contact region 53 formed on a bottom surface of said contact trench region 52. The contact trench 52 is formed with a fixed width along the longitudinal direction of the gate trench 10. The n⁺-type emitter region 13 is exposed on a side surface of the contact trench 52, and the p⁺-type base contact region 53 is exposed on the bottom surface of the contact trench 52. The dopant concentration of the p⁺-type base contact region 53 is, for example, $5 \times 10^{18}$ cm⁻³ to $1 \times 10^{20}$ cm⁻³.

Moreover, the emitter electrode 24 enters the contact trench 52, and is connected to the n⁺-type emitter region 13 on the side surface of the contact trench 52. Also, on the bottom surface of the contact trench 52, the emitter electrode 24 is connected to the p-type base region 42 via the p⁺-type base contact region 53.

According to this semiconductor device 51, because the side surface of the contact trench 52 can be effectively used as a region for contact with the n⁺-type emitter region 13, a junction area of the emitter electrode 24 with respect to the n⁺-type emitter region 13 can be sufficiently secured. Because a plane area of the n⁺-type emitter region 13 can thereby be sacrificed, the interval $L_1$ between one and the other gate trenches 10 of a pair of gate trenches 10 can be miniaturized to form a p-type base region 42 more minute than the conventional p-type base region. As a result of miniaturization of the gate trench 10, a trade-off relationship between the short-circuit capacity and ON-voltage of the device can be improved, so that a charge enhancement effect can be increased. $V_{CE}(\text{sat})$ in a low-current range can hence be improved.

Of course, the same effects as those of the semiconductor devices 1 and 41 of the first and second embodiments can also be achieved.

Figure 9:
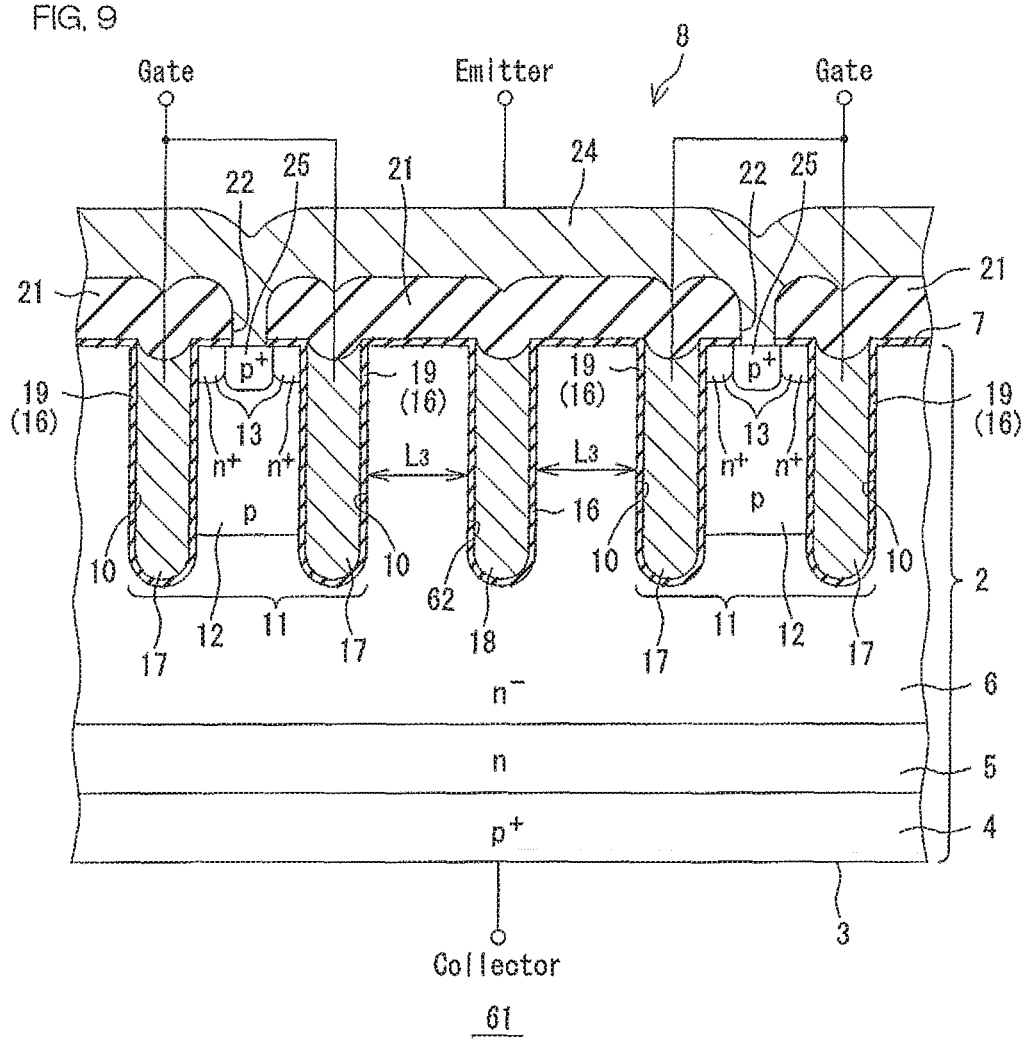
FIG. 9 is a schematic sectional view of a semiconductor device according to a fourth embodiment of the present invention.

FIG. 9 is a schematic sectional view of a semiconductor device 61 according to a fourth embodiment of the present invention. In FIG. 9, parts corresponding to the respective portions shown in FIG. 2 and FIG. 3 described above will be denoted by the same reference signs.

In the foregoing first embodiment, a plurality of emitter trenches 14 are formed between a pair of gate trenches 10, and the p-type floating region 15 is formed in each section between the plurality of emitter trenches 14. In contrast, in the semiconductor device 61 of the fourth embodiment, a single emitter trench 62 is formed between a pair of gate trenches 10, and the p-type floating region 15 is omitted.

Also by this semiconductor device 61, the same effects as those of the semiconductor device 1 of the first embodiment can be achieved.

Figure 10:
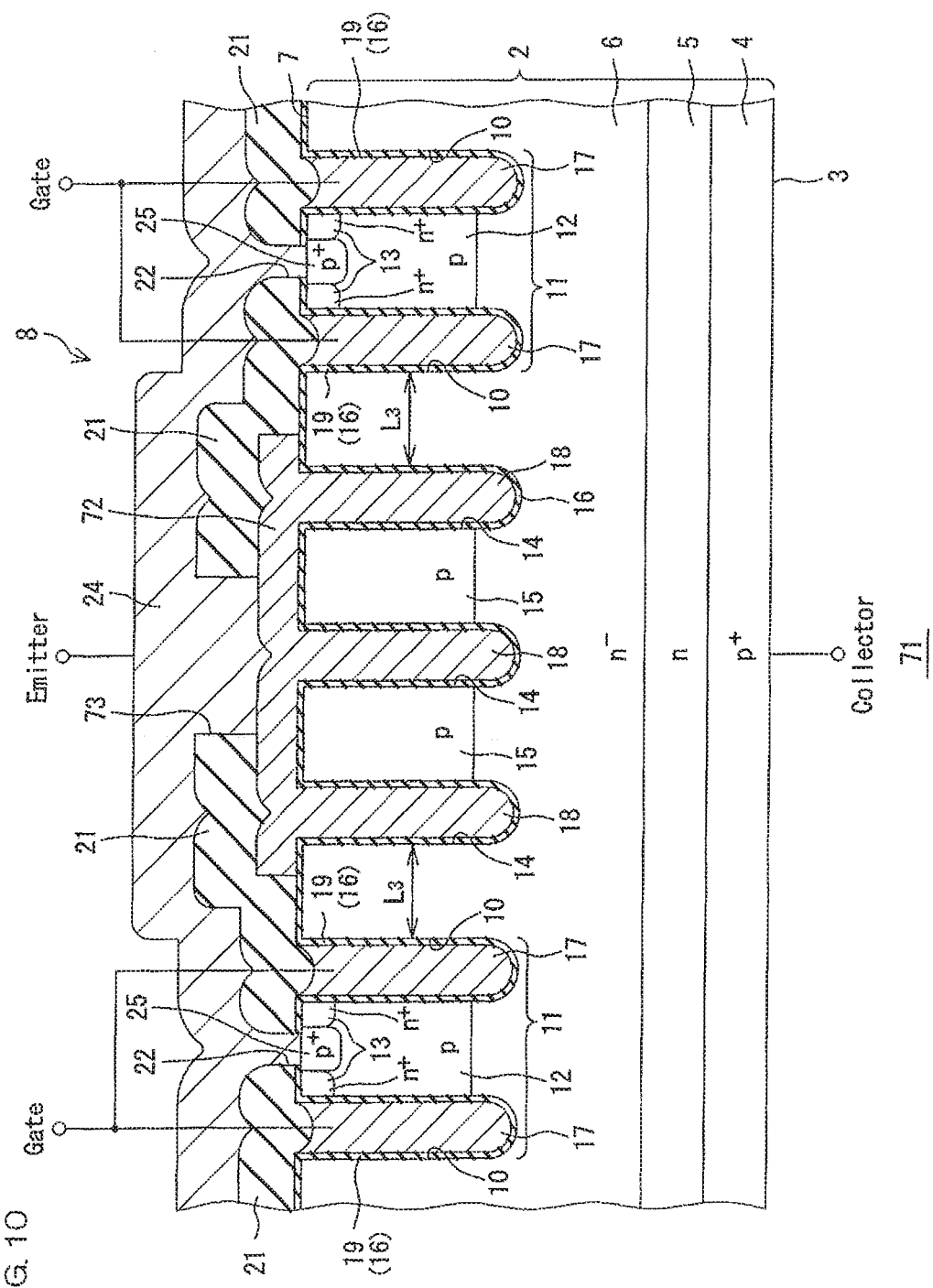
FIG. 10 is a schematic sectional view of a semiconductor device according to a fifth embodiment of the present invention.

FIG. 10 is a schematic sectional view of a semiconductor device 71 according to a fifth embodiment of the present invention. In FIG. 10, parts corresponding to the respective portions shown in FIG. 2 and FIG. 3 described above will be denoted by the same reference signs.

In the foregoing first embodiment, the contact portion 20 that collectively connects the plurality of buried electrodes 18 is disposed in the non-active region 9. In contrast, the semiconductor device 71 of the fifth embodiment includes, in the active region 8, a contact portion 72 that is disposed extending across the plurality of buried electrodes 18 in a direction to run across the plurality of emitter trenches 14. Also, in the interlayer film 21, a contact hole 73 is formed to selectively expose said contact portion 72. Thus, the plurality of buried electrodes 18 of the emitter trenches 14 are, in the active region 8, connected collectively by the contact portion 72.

Also by this semiconductor device 71, the same effects as those of the semiconductor device 1 of the first embodiment can be achieved.

Figure 11:
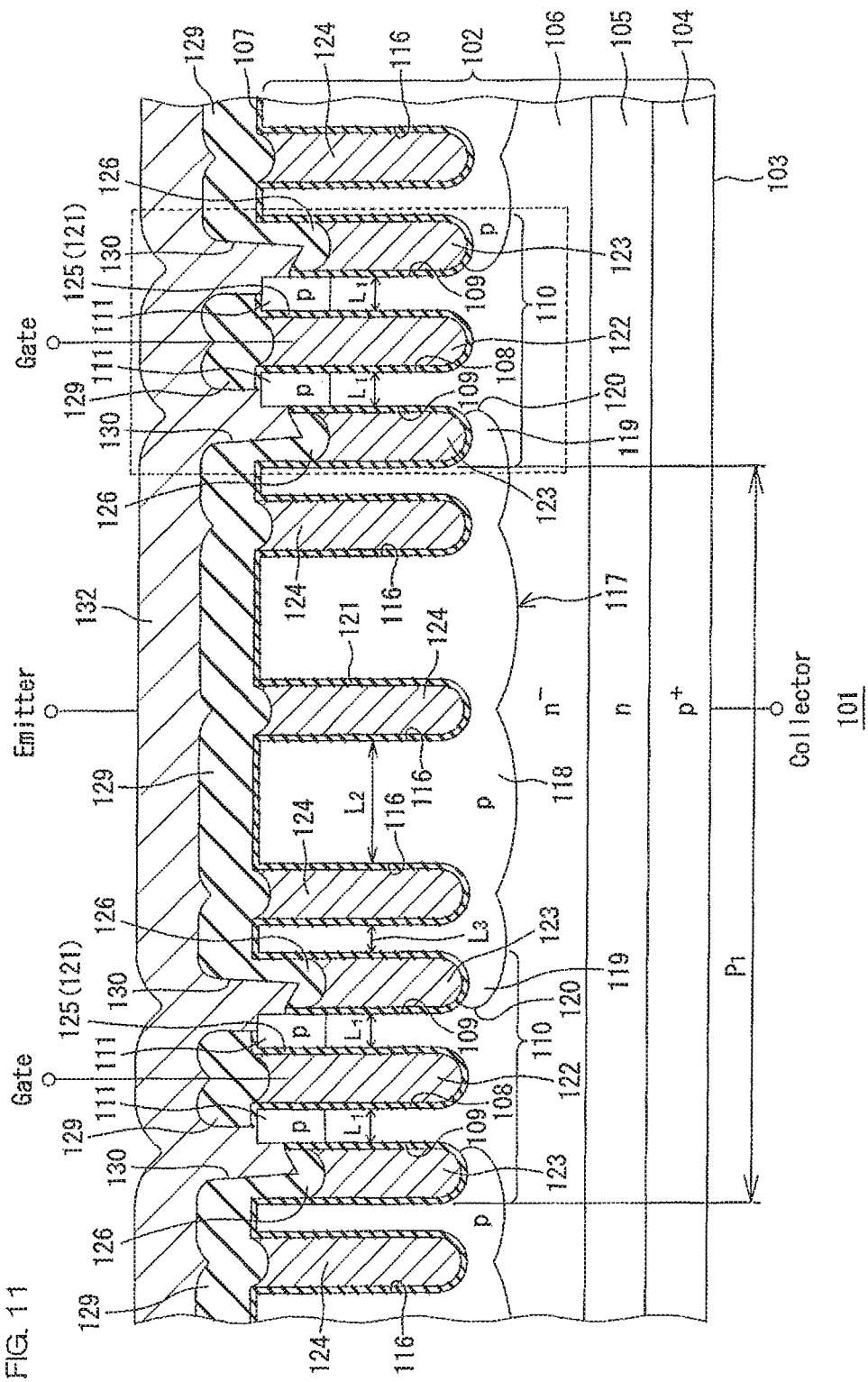
FIG. 11 is a schematic sectional view of a semiconductor device according to a sixth embodiment of the present invention.
Figure 12:
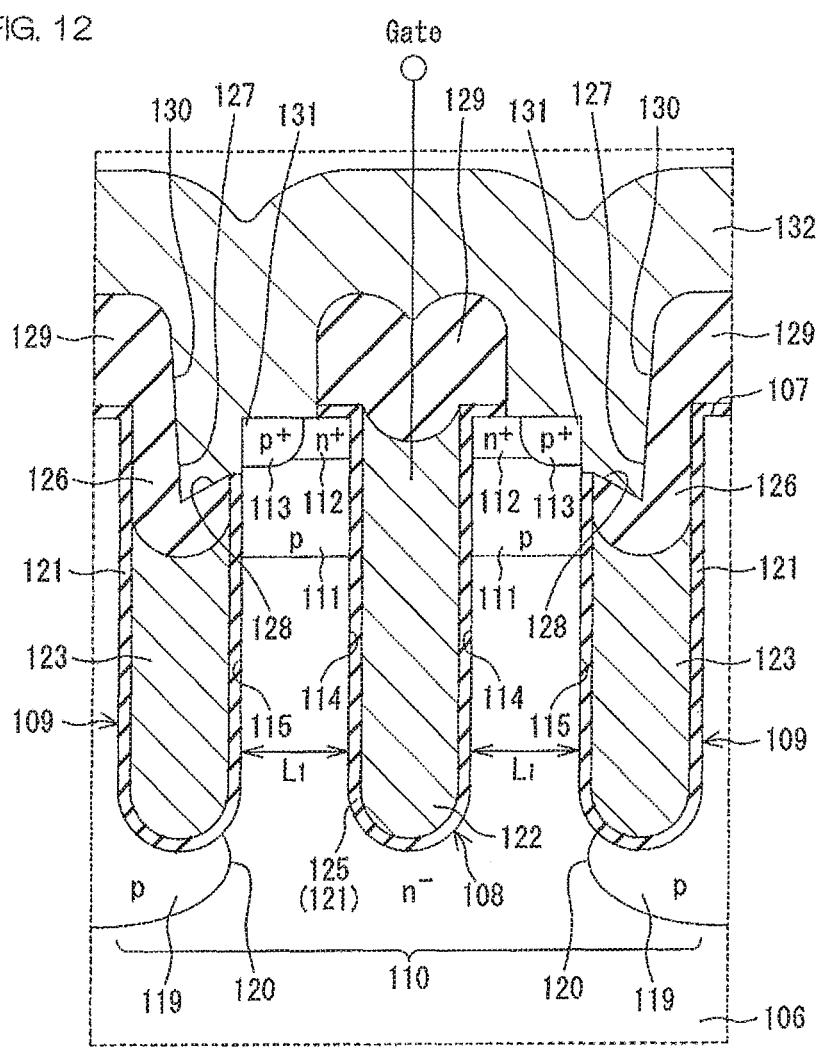
FIG. 12 is an enlarged view of a part enclosed by a broken line of FIG. 11.

FIG. 11 is a schematic sectional view of a semiconductor device 101 according to a sixth embodiment of the present invention. FIG. 12 is an enlarged view of a part enclosed by a broken line of FIG. 11.

The semiconductor device 101 is a device including IGBTs, and includes a semiconductor substrate 102 as an example of a semiconductor layer of the present invention. The semiconductor substrate 102 may be, for example, an n⁻-type silicon substrate having a thickness of 50 μm to 200 μm.

The semiconductor substrate 102 has a structure in which a p⁺-type collector region 104, an n-type buffer region 105, and an n⁻-type drift region 106 are stacked in order from the side of its back surface 103. The p⁺-type collector region 104 is exposed over the entire back surface 103 of the semiconductor substrate 102, and the n⁻-type drift region 106 is selectively exposed on a part of a front surface 107 of the semiconductor substrate 102.

As a p-type dopant of the p⁺-type collector region 104, for example, B (boron), Al (aluminum), and others can be used (the same applies to the following). On the other hand, as an n-type dopant of the n-type buffer region 105 and the n⁻-type drift region 106, for example, N (nitrogen), P (phosphorus), As (arsenic), and others can be used (the same applies to the following).

Also, the dopant concentration of the p⁺-type collector region 104 is, for example, $1 \times 10^{15}$ cm⁻³ to $2 \times 10^{19}$ cm⁻³. On the other hand, the dopant concentration of the n-type buffer region 105 is, for example, $1 \times 10^{15}$ cm⁻³ to $5 \times 10^{17}$ cm³, and the dopant concentration of the n⁻-type drift region 106 is $1 \times 10^{13}$ cm⁻³ to $5 \times 10^{14}$ cm⁻³.

On the side of the front surface 107 of the semiconductor substrate 102, a plurality of gate trenches 108 and a plurality of dummy trenches 109 are formed adjacent to each other. In the present embodiment, a trench unit 110 including a pair of dummy trenches 109 and a gate trench 108 sandwiched between the pair of dummy trenches 109 is disposed in plural numbers spaced at intervals in the transverse direction along the front surface 107 of the semiconductor substrate 102. The gate trenches 108 and the dummy trenches 109 are thereby formed in a stripe form as a whole.

The pitch $P_1$ of mutually adjacent trench units 110 is, for example, 2 μm to 7 μm. Also, in each trench unit 110, the intervals $L_1$ between the gate trench 108 and the dummy trenches 109 on both sides thereof (distances between side surfaces of the gate trench 108 and side surfaces of the dummy trenches 109) are preferably respectively 2 μm or less.

In each trench unit 100, on both sides of the gate trench 108 (regions between the same and the respective dummy trenches 109), a p-type base region 111 is formed, and further, an n⁺-type emitter region 112 and a p⁺-type base contact region 113 are formed in a front surface portion of the p-type base region 111 (refer to FIG. 12). In the present embodiment, an interface between the p-type base region 111 and the n⁻-type drift region 106 is set in a central portion or upper portion of the gate trench 108, and the p-type base region 111 is formed by diffusion at a relatively shallow position of the semiconductor substrate 102.

The n⁺-type emitter region 112 and the p⁺-type base contact region 113 are disposed adjacent to each other in the region between the gate trench 108 and the dummy trench 109. Specifically, n⁺-type emitter regions 112 are formed one each along both side surfaces 114 of the gate trench 108, and p⁺-type base contact regions 113 are formed one each along side surfaces 115 of the respective dummy trenches 109. The n⁺-type emitter regions 112 are thereby exposed on the front surface 107 of the semiconductor substrate 102 and the side surfaces 114 of the gate trenches 108. On the other hand, the p⁺-type base contact regions 113 are exposed on the front surface 107 of the semiconductor substrate 102 and the side surfaces 115 of the dummy trenches 109.

Also, the dopant concentration of the p-type base region 111 is, for example, $1 \times 10^{16}$ cm⁻³ to $1 \times 10^{18}$ cm⁻³. The dopant concentration of the n⁺-type emitter region 112 is $1 \times 10^{19}$ cm⁻³ to $5 \times 10^{20}$ cm⁻³. The dopant concentration of the p⁺-type base contact region 113 is, for example, $5 \times 10^{18}$ cm⁻³ to $1 \times 10^{20}$ cm⁻³.

Also, between trench units 110 adjacent on the side of the front surface 107 of the semiconductor substrate 102, a plurality of (in FIG. 11, three) emitter trenches 116 are formed. In the present embodiment, the plurality of emitter trenches 116 are formed in, for example, a stripe form (parallel to the gate trenches 108 and the dummy trenches 109), and disposed spaced at mutually equal intervals in the transverse direction along the front surface 107 of the semiconductor substrate 102. The interval $L_2$ of mutually adjacent emitter trenches 116 (distance between side surfaces of the emitter trenches 116) is, for example, 3 μm or less, and preferably, 0.8 μm to 3 μm. Also, the plurality of emitter trenches 116 are formed at the same depth as that of the gate trenches 108 and the dummy trenches 109. Because the emitter trenches 116 can thereby be formed by the same step as that for the gate trenches 108 and the dummy trenches 109, the manufacturing process can be simplified.

Out of the plurality of emitter trenches 116, a trench that is adjacent to the dummy trench 109 (trench that is opposed to the dummy trench 109 via no trench therewith) is disposed at an interval $L_3$ (distance between the side surface of the emitter trench 116 and the side surface of the dummy trench 109) of 0.5 μm to 20 μm with the dummy trench 109.

Also, in the semiconductor substrate 102, a p-type floating region 117 is formed. The p-type floating region 117 spreads over a region sandwiched by the dummy trenches 109 of mutually adjacent trench units 110, opposed via the emitter trenches 116. The p-type floating region 117 is a semiconductor region where a floating state is electrically maintained, and is separated from the gate trench 108 by the dummy trench 109 that is adjacent to the gate trench 108. The p-type floating region 117 is, in the present embodiment, formed deeper than the p-type base region 111.

The p-type floating region 117 has a bottom portion 118 that bulges to the side of the back surface 103 of the semiconductor substrate 102 with respect to a bottom portion of the emitter trenches 116 and an overlap portion 119 that goes around to the lower side of the dummy trench 109. The overlap portion 119 has an end portion 120 positioned on a side closer to the gate trench 108 with respect to the center in the width direction of said dummy trench 109. The end portion 120 is preferably not projecting to the side of the gate trench 108 with respect to the emitter trench 116.

Also, the dopant concentration of the p-type floating region 117 is, for example, $5 \times 10^{15}$ cm⁻³ to $1 \times 10^{18}$ cm⁻³.

In the gate trenches 108, the dummy trenches 109, and the emitter trenches 116, gate electrodes 122, first buried electrodes 123, and second buried electrodes 124 are filled, respectively, via an insulating film 121 (for example, silicon oxide ($SiO_2$)). The gate electrodes 122, the first buried electrodes 123, and the second buried electrodes 124 are made of, for example, a conductive material such as polysilicon. The insulating film 121 is integrally formed along inner surfaces of the gate trenches 108, inner surfaces of the dummy trenches 109, the front surface 107 of the semiconductor substrate 102, and inner surfaces of the emitter trenches 116. The part of the insulating film 121 in the gate trench 108 serves as a gate insulating film 125. Also, the first buried electrodes 123 and the second buried electrodes 124 are electrically connected to an emitter electrode 132 to be described later.

Also, in the present embodiment, the gate electrode 122 and the second buried electrode 124 fill back their respective trenches 108 and 116 up to the opening ends, whereas the first buried electrode 123 fills back the dummy trench 109 halfway in the depth direction thereof. In the dummy trench 109, a space without an electrode is thereby formed in a region over the first buried electrode 123. Moreover, a buried insulating film 126 is filled in the dummy trench 109 so as to fill back the space up to the opening end.

The buried insulating film 126 is made of, for example, an insulating material such as boron phosphorus silicate glass (BPSG) or silicon oxide ($SiO_2$), and has a thickness of 0.5 μm or more. In the buried insulating film 126 and the insulating film 121 thereunder, a removal portion 127 is selectively formed to expose the $p^+$-type base contact region 113 on the side surface 115 of the dummy trench 109. That is, the buried insulating film 126 selectively has an upper surface 128 that is at a position lower than that of the front surface 107 of the semiconductor substrate 102 so as to be continuous from the side surface 115 of the dummy trench 109, and the $p^+$-type base contact region 113 is exposed in a region of the side surface 115 of the dummy trench 109 between the upper surface 128 and the front surface 107.

On the front surface 107 of the semiconductor substrate 102, an interlayer film 129 made of, for example, an insulating material such as boron phosphorus silicate glass (BPSG) or silicon oxide ($SiO_2$) is stacked. The interlayer film 129 is formed integrally with the buried insulating film 126. In the interlayer film 129, a contact hole 130 is formed extending across the front surface 107 of the semiconductor substrate 102 and the opening end of the dummy trench 109. The contact hole 130 exposes the $n^+$-type emitter region 112 and the $p^+$-type base contact region 113 at the front surface 107 of the semiconductor substrate 102, and exposes the $p^+$-type base contact region 113 at the side surface 115 (removal portion 127) of the dummy trench 109. That is, the $p^+$-type base contact region 113 is exposed in a corner portion 131 of the dummy trench 109 defined by intersection of the front surface 107 and the side surface 115. In addition, the $n^+$-type emitter region 112 may selectively have a pullout portion pulled out in the transverse direction along the front surface 107 of the semiconductor substrate 102 from the side surface 114 of the gate trench 108, and only the pullout portion may be selectively exposed from the contact hole 130.

On the interlayer film 129, an emitter electrode 132 as an example of a contact electrode of the present invention is stacked. The emitter electrode 132 enters the contact hole 130, and is connected to the $n^+$-type emitter region 112 on the front surface 107 of the semiconductor substrate 102, and is connected to the $p^+$-type base contact region 113 in the corner portion 131 of the dummy trench 109.

Next, a manufacturing method of the semiconductor device 101 will be explained. FIG. 13A to FIG. 13K are views for explaining the manufacturing process of the semiconductor device 101 of FIG. 11 and the FIG. 12 in the order of steps. In addition, FIG. 13A to FIG. 13F show sections corresponding to FIG. 11, and FIG. 13G to FIG. 13K show sections corresponding to FIG. 12.

For manufacturing the semiconductor device 101, as shown in FIG. 13A, a mask 160 is formed on the front surface 107 of the $n^-$-type semiconductor substrate 102 ($n^-$-type drift region 106). In the mask 160, there is formed an opening to selectively expose a region that needs to be formed into the p-type floating region 117 in the front surface 107. Then, via the mask 160, a p-type dopant is ion-implanted into the front surface 107 of the semiconductor substrate 102. An ion-implanted region 161 is thereby formed.

Next, as shown in FIG. 13B, by the semiconductor substrate 102 being selectively etched, the gate trenches 108, the dummy trenches 109, and the emitter trenches 116 are simultaneously formed.

Figure 13C:
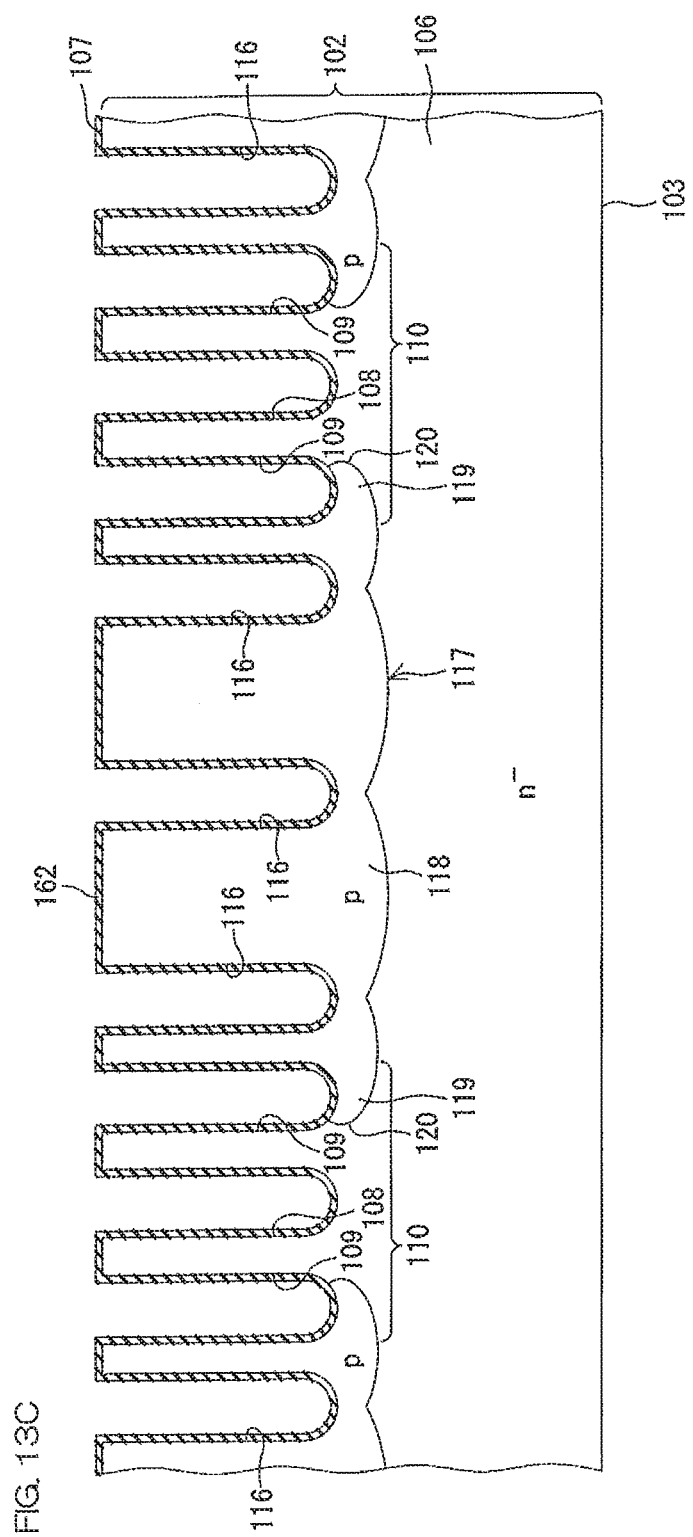
FIG. 13C is a view showing a following step of FIG. 13B.

Next, as shown in FIG. 13C, by the semiconductor substrate 102 being thermally oxidized, a sacrificial oxide film 162 is formed on the entire area of the front surface including the inner surfaces of the gate trenches 108, the dummy trenches 109, and the emitter trenches 116. Then, by annealing the semiconductor substrate 102 covered with the sacrificial oxide film 162, the p-type dopant in the ion-implanted region 161 is diffused (driven in). The annealing treatment is performed on a condition that the p-type dopant goes around to the lower side of the dummy trench 109. The p-type floating region 117 is thereby formed. In this case, because the semiconductor substrate 102 is covered with the sacrificial oxide film 162, ion seeping from the front surface of the substrate can be prevented, so that the p-type dopant can be efficiently diffused.

Figure 13D:
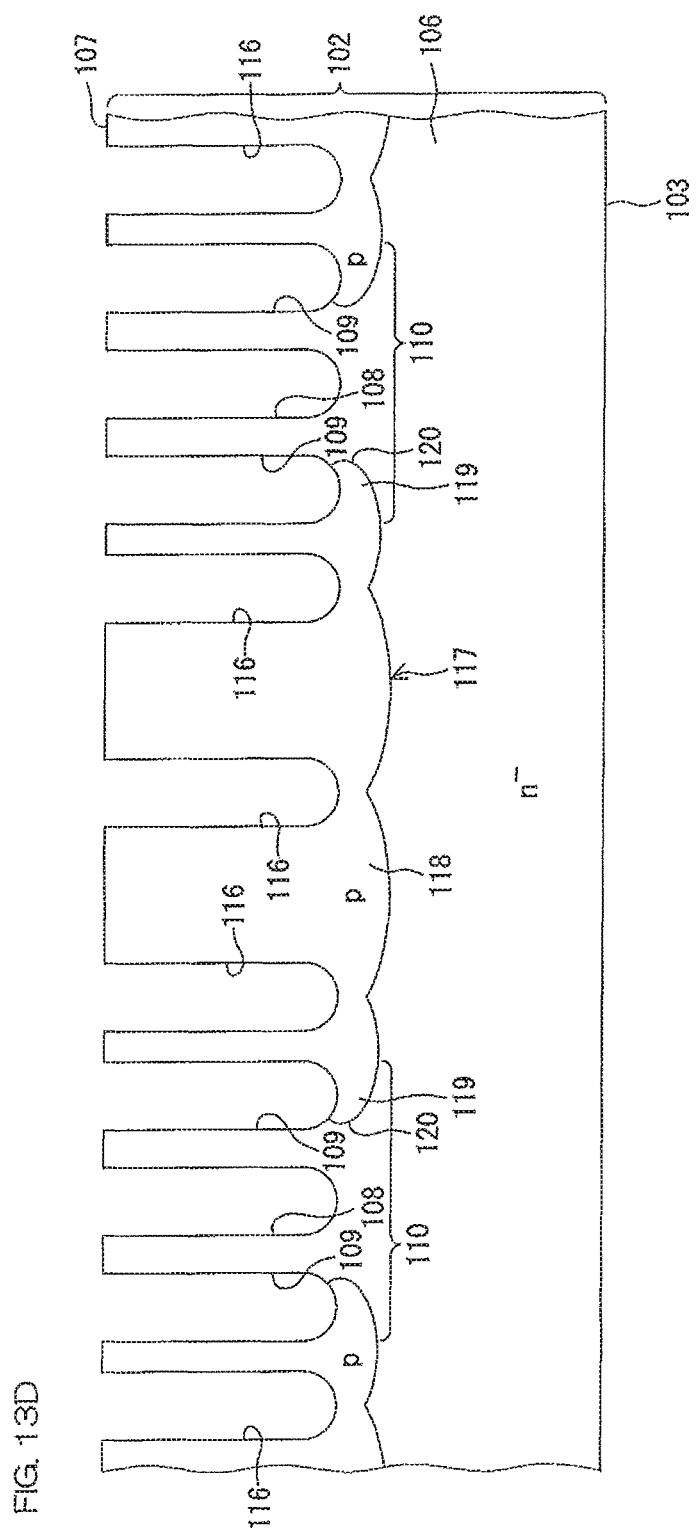
FIG. 13D is a view showing a following step of FIG. 13C.
Figure 13:
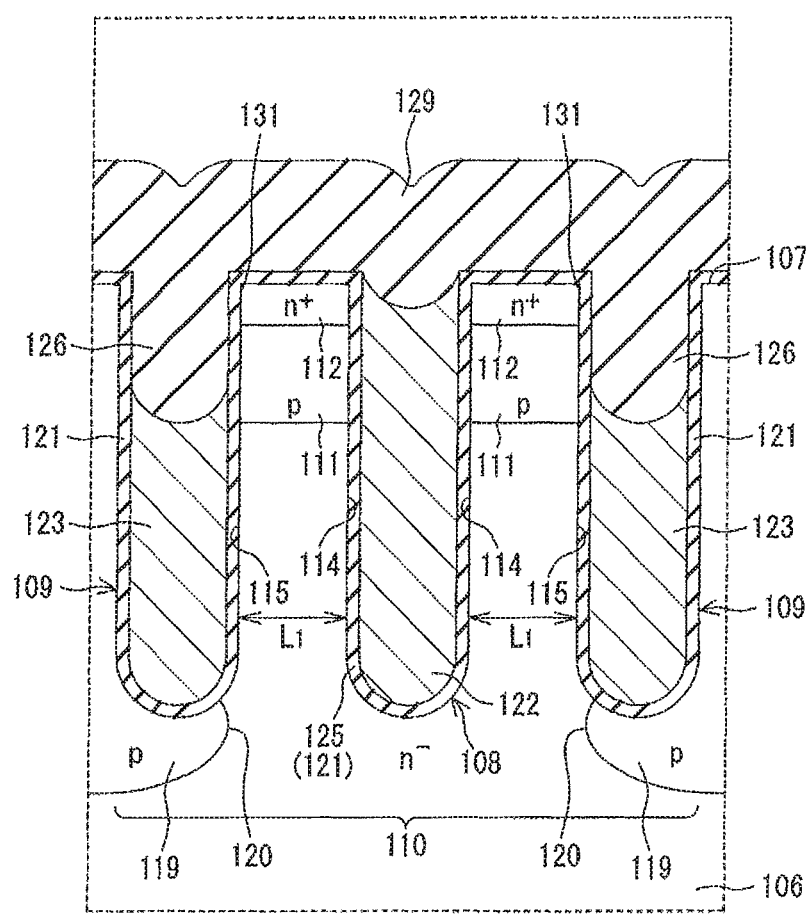
FIG. 13A is a view for explaining a manufacturing step of the semiconductor device of FIG. 12.
FIG. 13B is a view showing a following step of FIG. 13A.
FIG. 13E is a view showing a following step of FIG. 13D.
FIG. 13F is a view showing a following step of FIG. 13E.
FIG. 13G is a view showing a following step of FIG. 13F.
FIG. 13H is a view showing a following step of FIG. 13G.
FIG. 13I is a view showing a following step of FIG. 13H.
FIG. 13J is a view showing a following step of FIG. 13I.
FIG. 13K is a view showing a following step of FIG. 13J.

Next, as shown in FIG. 13D, the sacrificial oxide film 162 is stripped.

Next, as shown in FIG. 13E, by the semiconductor substrate 102 being thermally oxidized, the insulating film 121 (gate insulating film 125) is formed on the entire area of the front surface including the inner surfaces of the gate trenches 108, the dummy trenches 109, and the emitter trenches 116.

Next, as shown in FIG. 13F, an electrode material such as polysilicon is filled in the gate trenches 108, the dummy trenches 109, and the emitter trenches 116. The gate electrodes 122, the first buried electrodes 123, and the second buried electrodes 124 are thereby simultaneously formed.

Next, as shown in FIG. 13G, by n-type and p-type dopants being selectively ion-implanted and diffused into the front surface 107 of the semiconductor substrate 102, the p-type base regions 111 and the $n^+$-type emitter regions 112 are formed in order.

Next, as shown in FIG. 13H, by etching the first buried electrodes 123 from upper surfaces, the filled states of the gate electrodes 122 and the second buried electrodes 124 are kept maintained, while only the first buried electrodes 123 are selectively dug down.

Next, as shown in FIG. 13I, by depositing an insulating material such as boron phosphorus silicate glass (BPSG) or silicon oxide ($SiO_2$) on the front surface 107 of the semiconductor substrate 102, the spaces over the first buried electrodes 123 are filled back with said insulating material, and the front surface 107 is covered with said insulating material. The buried insulating film 126 and the interlayer film 129 are thereby simultaneously formed.

Figure 13J:
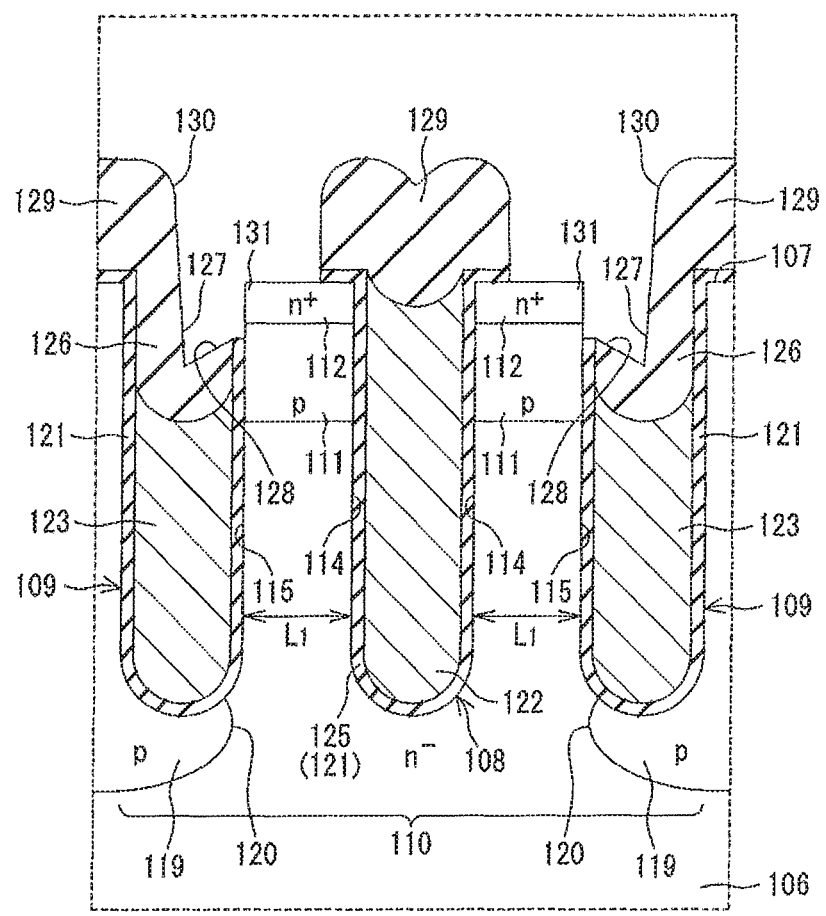

Next, as shown in FIG. 13J, by selectively etching the interlayer film 129 and the buried insulating film 126, the contact holes 130 and the removal portions 127 are simultaneously formed.

Next, as shown in FIG. 13K, a p-type dopant is selectively ion-implanted and diffused into the front surface 107 of the semiconductor substrate 102 exposed in the contact holes 130. The $p^+$-type base contact regions 113 are thereby formed.

Thereafter, by n-type and p-type dopants being selectively ion-implanted and diffused into the back surface 103 of the semiconductor substrate 102 after the emitter electrode 132 and the like being formed on the side of the front surface 107 of the semiconductor substrate 102, the n-type buffer region 105 and the $p^+$-type collector region 104 are formed in order.

Through the steps as above, the semiconductor device 101 shown in FIG. 11 and FIG. 12 is obtained. However, FIG. 13A to FIG. 13K merely represent a part of the manufacturing process of the semiconductor device 101, and said manufacturing process may include steps not shown by FIG. 13A to FIG. 13K.

According to this semiconductor device 101, because the side surface 115 of the dummy trench 109 can be effectively used as the $p^+$-type base contact region 113, a junction area of the emitter electrode 132 with respect to the p-type base region 111 can be sufficiently secured by both surfaces of the front surface 107 of the semiconductor substrate 102 and the side surface 115 of the dummy trench 109. Because a plane area of the p-type base region 111 can thereby be sacrificed, the interval $L_1$ between the gate trench 108 and the dummy trench 109 can be miniaturized to form a p-type base region 111 more minute than the conventional p-type base region. Furthermore, because the dummy trenches 109 can be formed using the same mask as that for the gate trenches 108, misalignment with respect to the gate trenches 108 does not occur. Moreover, alignment of the emitter electrode 132, for which alignment with an area including a plane area of the dummy trenches 109 suffices, can thus be easily attained.

Specifically, first, by etching the semiconductor substrate 102 using the same mask, the gate trenches 108, the dummy trenches 109, and the emitter trenches 116 are simultaneously formed (FIG. 13B). Next, by filling polysilicon in the trenches 108, 109, and 116, the gate electrodes 122, the first buried electrodes 123, and the second buried electrodes 124 are formed (FIG. 13F). Next, a mask to selectively expose the dummy trenches 109 is formed on the semiconductor substrate 102, and via the mask, an upper portion of the polysilicon in the dummy trenches 109 is selectively removed by etching. Spaces are thereby formed in regions over the first buried electrodes 123 of the dummy trenches 109 (FIG. 13H). Next, the interlayer film 129 is formed by depositing on the semiconductor substrate 102 an insulating material such as BPSG by, for example, a CVD method (FIG. 13I). A part of the insulating material enters into the dummy trenches 109 as the buried insulating film 126. Next, a mask to form the contact holes 130 is aligned with respect to the semiconductor substrate 102. In this case, because end portions of the contact holes 130 may cover the dummy trenches 109, the alignment can be attained in a wide area including the front surface 107 of the semiconductor substrate 102 and a plane area of the dummy trenches 109. Then, via said mask, the interlayer film 129 and the buried insulating film 126 are continuously etched. The contact holes 130 and the removal portions 127 are thereby simultaneously formed (FIG. 13J). Thereafter, by ion-implanting a p-type dopant using the interlayer film 129 as a mask to form the p$^+$-type base contact regions 113 in a self-aligned manner, the p$^+$-type base contact regions 113 can be reliably formed in the corner portions 131 of the dummy trenches 109 (FIG. 13K). Furthermore, because the contact holes 130 can be formed relatively wide, a part of the emitter electrode 132 using aluminum (Al) or the like can be used as plugs, even without using plugs excellent in filling ability, such as tungsten (W).

As a result of miniaturization of the trench structure as above, a trade-off relationship between the short-circuit capacity and ON-voltage of the device can be improved, so that a charge enhancement effect can be increased. $V_{CE}(sat)$ in a low-current range can hence be improved.

Also, according to this semiconductor device 101, the gate trench 108 filled with the gate electrode 122 (hereinafter, referred to as a "gate junction trench") is separated from the p-type floating region 117 by the dummy trench 109 filled with the first buried electrode 123 connected to the n$^+$-type emitter region 112 (hereinafter, referred to as an "emitter junction trench"). The p-type floating region 117 and the gate junction trench can thereby be prevented from joining. A stray capacitance between the gate junction trench and the p-type floating region 117 can therefore be eliminated.

On the other hand, the n$^-$-type drift region 106 which the gate junction trench joins across the depth direction is to be grounded together with the p$^+$-type collector region 104. Therefore, at switching operation, a capacitance change between the gate junction trench and the n$^-$-type drift region 106 is stabilized, so that noise does not easily occur. As a result thereof, generation of noise and switching loss at switching operation can be reduced.

Also, because the interval $L_1$ between the emitter junction trench and the gate junction trench is 2 μm or less, withstand voltage can also be satisfactorily maintained.

Further, according to this semiconductor device 101, because the p-type floating region 117 (overlap portion 119) is formed up to a bottom portion of the emitter junction trench, a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region 117 that is deeper than the p-type base region 111, while the p-type base region 111 may be shallow, the channel length (length in the depth direction of the gate trench 108) can also be reduced to suppress a rise in ON-voltage by appropriately designing the depth of the p-type base region 111.

Figure 15:
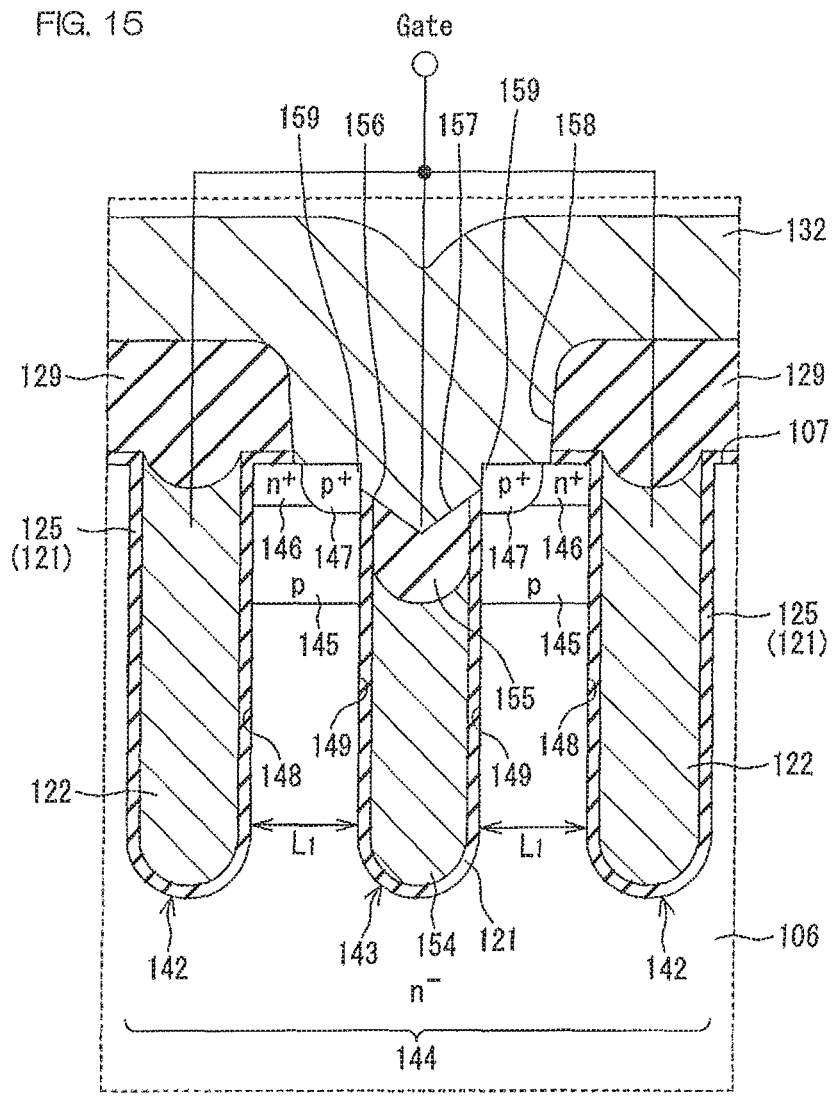
FIG. 15 is an enlarged view of a part enclosed by a broken line of FIG. 14.

FIG. 14 is a schematic sectional view of a semiconductor device 141 according to a seventh embodiment of the present invention. FIG. 15 is an enlarged view of a part enclosed by a broken line of FIG. 14. In FIG. 14 and FIG. 15, parts corresponding to the respective portions shown in FIG. 11 and FIG. 12 described above will be denoted by the same reference signs.

In the foregoing sixth embodiment, the trench unit 110 includes a pair of dummy trenches 109 and a gate trench 108 sandwiched between the pair of dummy trenches 109. In contrast, the semiconductor device 141 of the seventh embodiment has a trench unit 144 including a pair of gate trenches 142 and a dummy trench 143 sandwiched between the pair of gate trenches 142. In this case, the interval $L_3$ between the gate trench 142 and the emitter trench 116 (distance between the side surface of the gate trench 142 and the side surface of the emitter trench 116) is preferably 2 μm or less.

In each trench unit 144, on both sides of the dummy trench 143 (regions between the same and the respective gate trenches 142), a p-type base region 145 is formed, and further, an n$^+$-type emitter region 146 and a p$^+$-type base contact region 147 are formed in a front surface portion of the p-type base region 145 (refer to FIG. 15). In the present embodiment, an interface between the p-type base region 145 and the n$^-$-type drift region 106 is set in a central portion or upper portion of the gate trench 142, and the p-type base region 145 is formed by diffusion at a relatively shallow position of the semiconductor substrate 102.

The n$^+$-type emitter region 146 and the p$^+$-type base contact region 147 are disposed adjacent to each other in the region between the gate trench 142 and the dummy trench 143. Specifically, n$^+$-type emitter regions 146 are formed one each along side surfaces 148 of the respective gate trenches 142, and p$^+$-type base contact regions 147 are formed one each along both side surfaces 149 of the dummy trench 143. The n$^+$-type emitter regions 146 are thereby exposed on the front surface 107 of the semiconductor substrate 102 and the side surfaces 148 of the gate trenches 142. On the other hand, the p$^+$-type base contact regions 147 are exposed on the front surface 107 of the semiconductor substrate 102 and the side surfaces 149 of the dummy trenches 143.

Also, in the semiconductor substrate 102, a p-type floating region 150 is formed. The p-type floating region 150 spreads over each section between the plurality of emitter trenches 116. The p-type floating region 150 is a semiconductor region where a floating state is electrically maintained, and is separated from the gate trench 142 by the emitter trench 116 that is adjacent to the gate trench 142. The p-type floating region 150 is, in the present embodiment, formed deeper than the p-type base region 145.

The p-type floating region 150 has a bottom portion 151 that bulges to the side of the back surface 103 of the semiconductor substrate 102 with respect to a bottom portion of the emitter trenches 116 and an overlap portion 152 that goes around to the lower side of the emitter trench 116 adjacent to the gate trench 142. The overlap portion 152 has an end portion 153 positioned on a side closer to the gate trench 142 with respect to the center in the width direction of said emitter trench 116. The end portion 153 is preferably not projecting to the side of the gate trench 142 with respect to the emitter trench 116.

Such a p-type floating region 150 can be formed, for example, in the same manner as the foregoing p-type floating region 117.

In the dummy trench 143, a first buried electrode 154 is filled via an insulating film 121. The first buried electrode 154 is made of, for example, a conductive material such as polysilicon, and is electrically connected to the gate electrode 122. Also, the first buried electrode 154 fills back the dummy trench 143 halfway in the depth direction thereof. In the dummy trench 143, a space without an electrode is thereby formed in a region over the first buried electrode 154. Moreover, a buried insulating film 155 is filled in the dummy trench 143 so as to fill back the space up to the opening end.

The buried insulating film 155 is made of, for example, an insulating material such as boron phosphorus silicate glass (BPSG) or silicon oxide ($SiO_2$), and has a thickness of 0.5 µm or more. In the buried insulating film 155 and the insulating film 121 thereunder, a removal portion 156 is selectively formed to expose the $p^+$-type base contact regions 147 on both side surfaces 149 of the dummy trench 143. That is, the buried insulating film 155 selectively has an upper surface 157 that is at a position lower than that of the front surface 107 of the semiconductor substrate 102 so as to be continuous from both side surfaces 149 of the dummy trench 143, and the $p^+$-type base contact regions 147 are exposed in a region of both side surfaces 149 of the dummy trench 143 between the upper surface 157 and the front surface 107.

In the interlayer film 129, a contact hole 158 is formed extending across the p-type base regions 145 opposed across the dummy trench 143. The contact hole 158 exposes the $n^+$-type emitter regions 146 and the $p^+$-type base contact regions 147 at the front surface 107 of the semiconductor substrate 102, and exposes the $p^+$-type base contact regions 147 at both side surfaces 149 (removal portion 156) of the dummy trench 143. That is, the $p^+$-type base contact regions 147 are exposed in both corner portions 159 of the dummy trench 143 defined by intersection of the front surface 107 and the side surfaces 149. In addition, the $n^+$-type emitter region 146 may selectively have a pullout portion pulled out in the transverse direction along the front surface 107 of the semiconductor substrate 102 from the side surface 148 of the gate trench 142, and only the pullout portion may be selectively exposed from the contact hole 158.

Moreover, the emitter electrode 132 enters the contact hole 158, and is connected to the $n^+$-type emitter regions 146 on the front surface 107 of the semiconductor substrate 102, and is connected to the $p^+$-type base contact regions 147 in both corner portions 159 of the dummy trench 143.

Also by this semiconductor device 141, the same effects as those of the semiconductor device 101 of the sixth embodiment can be achieved.

The embodiments of the present invention are described above, however, the present invention can also be carried out in other embodiments.

For example, the above-described features grasped from the disclosures of the respective embodiments described above may be combined with each other even among different embodiments.

Also, in the foregoing embodiments, only the arrangements of IGBTs included in the semiconductor devices 1, 41, 51, 61, 71, 101, and 141 are illustrated, however, a semiconductor device of the present invention may include elements other than IGBTs (for example, MOSFETs, diodes, and the like) in a region different from a forming region of IGBTs.

Various other design modifications can be made within the scope of the matters described in the claims.

The embodiments of the present invention are merely specific examples used to clarify the technical contents of the present invention, and the present invention should not be interpreted as being limited to only these specific examples, and the spirit and scope of the present invention shall be limited only by the accompanying claims.

The present application corresponds to Japanese Patent Application No. 2012-182169 filed on Aug. 21, 2012 in the Japan Patent Office, Japanese Patent Application No. 2012-182168 filed on Aug. 21, 2012 in the Japan Patent Office, and Japanese Patent Application No. 2013-167477 filed on Aug. 12, 2013 in the Japan Patent Office, and the entire disclosures of these applications are incorporated herein by reference.

In addition, from the description of the specification and drawings, the following features can be extracted besides the inventions described in the claims.

(Section 1) A semiconductor device including a semiconductor layer, a gate trench formed in the semiconductor layer, a gate electrode filled via a gate insulating film in the gate trench, a dummy trench formed spaced at a predetermined interval lateral to the gate trench, an $n^+$-type emitter region, a p-type base region, and an $n^-$-type drift region disposed, in a region between the gate trench and the dummy trench, in order in a depth direction of the gate trench from a front surface side of the semiconductor layer, a $p^+$-type collector region disposed on a back surface side of the semiconductor layer with respect to the $n^-$-type drift region, a buried insulating film being a buried insulating film filled in the dummy trench and having an upper surface at a bottom side of the dummy trench with respect to the front surface of the semiconductor layer, for selectively exposing as a contact region a part of the p-type base region at a part from the front surface to the upper surface in a side surface of the dummy trench, and a contact electrode filled in a region over the buried insulating film of the dummy trench, connected to the contact region on the side surface of the dummy trench.

According to this arrangement, because the side surface of the dummy trench can be effectively used as the contact region, a junction area of the contact electrode with respect to the p-type base region can be sufficiently secured. Because a plane area of the p-type base region can thereby be sacrificed, the interval between the gate trench and the dummy trench can be miniaturized to form a p-type base region more minute than the conventional p-type base region. Furthermore, because the dummy trench can be formed using the same mask as that for the gate trench, misalignment with respect to the gate trench does not occur. Moreover, alignment of the contact electrode, for which alignment with an area including a plane area of the dummy trench suffices, can thus be easily attained.

Also, as a result of miniaturization of the trench structure, a trade-off relationship between the short-circuit capacity and ON-voltage of the device can be improved, so that a charge enhancement effect can be increased. $V_{CE}(sat)$ in a low-current range can hence be improved.

(Section 2) The semiconductor device according to section 1, wherein the semiconductor device further includes a first buried electrode filled via an insulating film in a region under the buried insulating film of the dummy trench.

(Section 3) The semiconductor device according to section 2, wherein the semiconductor device has a trench unit including a pair of the dummy trenches and a gate trench sandwiched between the pair of dummy trenches.

(Section 4) The semiconductor device according to section 3, wherein the first buried electrode is electrically connected with the $n^+$-type emitter region.

(Section 5) The semiconductor device according to section 4, wherein the trench unit is formed in plural numbers in a transverse direction along the front surface of the semiconductor layer, and the semiconductor device further includes a plurality of emitter trenches formed between the trench units adjacent to each other, a second buried electrode filled via an insulating film in the emitter trench, electrically connected with the $n^+$-type emitter region, and a p-type floating region formed between the dummy trench of the trench unit and the dummy trench of the trench unit next thereto.

(Section 6) The semiconductor device according to section 5, wherein the p-type floating region is formed deeper than the p-type base region, and includes an overlap portion that goes around to a lower side of the dummy trench.

According to this arrangement, because the p-type floating region (overlap portion) is formed up to a bottom portion of the dummy trench filled with the first buried electrode connected to the $n^+$-type emitter region (hereinafter, referred to as an "emitter junction trench"), a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region that is deeper than the p-type base region, while the p-type base region may be shallow, a rise in ON-voltage can also be suppressed by appropriately designing the depth of the p-type base region.

(Section 7) The semiconductor device according to section 6, wherein the overlap portion has an end portion positioned on a side closer to the gate trench with respect to a center in a width direction of the emitter trench.

According to this arrangement, a collector-emitter voltage to be applied to the emitter junction trench can be more satisfactorily relieved.

(Section 8) The semiconductor device according to section 2, wherein the semiconductor device has a trench unit including a pair of the gate trenches and a dummy trench sandwiched between the pair of gate trenches.

(Section 9) The semiconductor device according to section 8, wherein the first buried electrode is electrically connected with the gate electrode.

(Section 10) The semiconductor device according to section 9, wherein the trench unit is formed in plural numbers in a transverse direction along the front surface of the semiconductor layer, and the semiconductor device further includes a plurality of emitter trenches formed between the trench units adjacent to each other, a second buried electrode filled via an insulating film in the emitter trench, electrically connected with the $n^+$-type emitter region, and a p-type floating region formed between the plurality of emitter trenches.

(Section 11) The semiconductor device according to section 10, wherein the p-type floating region is formed deeper than the p-type base region, and includes an overlap portion that goes around to a lower side of the emitter trench.

According to this arrangement, because the p-type floating region (overlap portion) is formed up to a bottom portion of the emitter trench filled with the second buried electrode connected to the $n^+$-type emitter region (hereinafter, referred to as an "emitter junction trench"), a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region that is deeper than the p-type base region, while the p-type base region may be shallow, a rise in ON-voltage can also be suppressed by appropriately designing the depth of the p-type base region.

(Section 12) The semiconductor device according to section 11, wherein the overlap portion has an end portion positioned on a side closer to the gate trench with respect to a center in a width direction of the emitter trench.

According to this arrangement, a collector-emitter voltage to be applied to the emitter junction trench can be more satisfactorily relieved.

(Section 13) The semiconductor device according to any one of sections 1 to 12, wherein the buried insulating film has a thickness of 0.5 μm or more.

(Section 14) The semiconductor device according to any one of sections 1 to 13, wherein the dummy trench is disposed at an interval of 2 μm or less with the gate trench.

(Section 15) The semiconductor device according to any one of sections 1 to 14, wherein the $n^+$-type emitter region has an n-type dopant concentration of $1 \times 10^{19}$ cm$^{-3}$ to $5 \times 10^{20}$ cm$^{-3}$.

(Section 16) The semiconductor device according to any one of sections 1 to 15, wherein the p-type base region has a p-type dopant concentration of $1 \times 10^{16}$ cm$^{-3}$ to $1 \times 10^{18}$ cm$^{-3}$.

(Section 17) The semiconductor device according to any one of sections 1 to 16, wherein the $n^-$-type drift region has an n-type dopant concentration of $1 \times 10^{13}$ cm$^{-3}$ to $5 \times 10^{14}$ cm$^{-3}$.

(Section 18) The semiconductor device according to any one of sections 1 to 17, wherein the $p^+$-type collector region has a p-type dopant concentration of $1 \times 10^{15}$ cm$^3$ to $2 \times 10^{19}$ cm$^{-3}$.

EXAMPLES

Next, the present invention will be described based on examples, but the present invention is not limited by the following examples.

A withstand voltage test was performed for four types of devices mutually different in the interval $L_3$ between the gate trench 10 and the emitter trench 14, regarding the structure of the semiconductor device 1 shown in FIG. 2, in order to demonstrate the effect of an increase in withstand voltage of the present invention. The result is shown in FIG. 16. According to FIG. 16, it could be confirmed that the withstand voltage is 1472V at a trench interval $L_3$ of 0.8 m, and 1456V at 1.35 m, and 1435V at 2 μm, and all are excellent in withstand voltage performance. On the other hand, the device with a trench interval $L_3$ of 2.8 m, the withstand voltage of which remained 1320V, is inferior in withstand voltage performance to the devices with trench intervals $L_3$ of 2 μm or less.

Next, $V_{CE}$-$I_{Cf}$ characteristics of four types of devices that are mutually different in the interval $L_1$ between the gate trench 108 and the dummy trench 109 were examined, regarding the structure of the semiconductor device 101 shown in FIG. 11, in order to confirm how the effect to improve the trade-off relationship between the short-circuit capacity and ON-voltage ($V_{CE}$) changes depending on said interval $L_1$. The result is shown in FIG. 17. In FIG. 17, device A (trench interval $L_1$=2 μm: alternate long and short dashed line) and device C (trench interval $L_1$=3.5 m: broken line) are shown.

According to FIG. 17, it could be confirmed that the narrower the trench interval $L_1$, the lower $V_{CE}$(sat) at rising and the lower steady loss (refer to the lower right enlarged view of FIG. 17). Also, it could be confirmed that in a high-current range of $I_{Cf}$, the saturation current density has been lowered by trench miniaturization (a reduction in volume of the p-type base region 111), and the short-circuit capacity has been increased.

The invention claimed is:

1. A semiconductor device comprising:
a semiconductor layer;
a plurality of gate trenches formed in the semiconductor layer;
a gate electrode filled via a gate insulating film in the plurality of gate trenches;
an n$^+$-type emitter region, a p-type base region, and an n$^-$-type drift region disposed, lateral to each gate trench, in order in a depth direction of the gate trench from a front surface side of the semiconductor layer;
a p$^+$-type collector region disposed on a back surface side of the semiconductor layer with respect to the n$^-$-type drift region;
an emitter trench formed between the plurality of gate trenches adjacent to each other;
a buried electrode filled via an insulating film in the emitter trench, electrically connected with the n$^+$-type emitter region;
a p-type floating region formed in the semiconductor layer and, wherein
the emitter trench has one side surface being in contact with the n$^-$-type drift region which is disposed between the emitter trench and the gate trench, and the other side surface being in contact with the p-type floating region.

2. The semiconductor device according to claim 1, wherein the emitter trench is disposed at an interval of 2 μm or less via an n$^-$-type drift region with the gate trench.

3. The semiconductor device according to claim 1, wherein the emitter trench is formed in plural numbers, and the p-type floating region is formed between the plurality of emitter trenches.

4. The semiconductor device according to claim 3, wherein the p-type floating region is formed deeper than the p-type base region, and includes an overlap portion that goes around to a lower side of an emitter trench closest to the gate trench out of the plurality of emitter trenches.

5. The semiconductor device according to claim 4, wherein the overlap portion has an end portion positioned on a side closer to the gate trench with respect to a center in a width direction of the emitter trench.

6. The semiconductor device according to claim 3, wherein the semiconductor device comprises an active region set on the semiconductor layer and a non-active region adjacent to the active region, and
a contact portion disposed, in the non-active region, on the semiconductor layer so as to extend across the buried electrodes filled in the plurality of emitter trenches, for collectively connecting to the plurality of buried electrodes.

7. The semiconductor device according to claim 3, wherein the plurality of emitter trenches are disposed at an interval of 3 μm or less from each other.

8. The semiconductor device according to claim 1, wherein the p-type floating region is formed at the same depth as that of the p-type base region.

9. The semiconductor device according to claim 1, wherein the emitter trench is formed at the same depth as that of the gate trench.

10. The semiconductor device according to claim 1, wherein
the gate trenches are disposed one pair each in a transverse direction along the front surface of the semiconductor layer, and
the pair of gate trenches are opposed in the transverse direction via the p-type base region that is common thereto.

11. The semiconductor device according to claim 10, wherein one of the pair of gate trenches is disposed at an interval of 2 μm to 7 μm with respect to the other.

12. The semiconductor device according to claim 1, wherein the n$^+$-type emitter region has an n-type dopant concentration of $1\times10^{19}$ cm$^{-3}$ to $5\times10^{20}$ cm$^{-3}$.

13. The semiconductor device according to claim 1, wherein the p-type base region has a p-type dopant concentration of $1\times10^{16}$ cm$^{-3}$ to $1\times10^{18}$ cm$^{-3}$.

14. The semiconductor device according to claim 1, wherein the n$^-$-type drift region has an n-type dopant concentration of $1\times10^{13}$ cm$^{-3}$ to $5\times10^{14}$ cm$^{-3}$.

15. The semiconductor device according to claim 1, wherein the p$^+$-type collector region has a p-type dopant concentration of $1\times10^{15}$ cm$^{-3}$ to $2\times10^{19}$ cm$^{-3}$.

16. The semiconductor device according to claim 1, wherein the n$^+$-type emitter region selectively has a pullout portion pulled out in a transverse direction along the front surface of the semiconductor layer from a side surface of the gate trench.

* * * * *